(12) United States Patent
Heim et al.

(10) Patent No.: US 7,492,076 B2
(45) Date of Patent: Feb. 17, 2009

(54) ELECTROACTIVE POLYMER TRANSDUCERS BIASED FOR INCREASED OUTPUT

(75) Inventors: Jonathan R. Heim, Pacifica, CA (US); Ilya Polyakov, San Francisco, CA (US); Alireza Zarrabi, Santa Clara, CA (US); Otto Hui, Burlingame, CA (US)

(73) Assignee: Artificial Muscle, Inc., Sunnyvale, CA (US)

( * ) Notice: Subject to any disclaimer, the term of this patent is extended or adjusted under 35 U.S.C. 154(b) by 112 days.

(21) Appl. No.: 11/618,577

(22) Filed: Dec. 29, 2006

(65) Prior Publication Data

US 2008/0157631 A1    Jul. 3, 2008

(51) Int. Cl.
*H01L 41/08* (2006.01)
(52) U.S. Cl. .................... 310/330; 310/800
(58) Field of Classification Search ......... 310/330–332, 310/328, 800
See application file for complete search history.

(56) References Cited

U.S. PATENT DOCUMENTS

| | | | |
|---|---|---|---|
| 4,283,649 A | 8/1981 | Heinouchi |
| 4,284,921 A | 8/1981 | Lemonon et al. |
| 4,605,167 A | 8/1986 | Maehara |
| 4,654,554 A | 3/1987 | Kishi |
| 4,911,057 A | 3/1990 | Fishman |
| 5,085,401 A | 2/1992 | Botting et al. |
| 5,900,572 A | 5/1999 | Aaroe |
| 5,977,685 A | 11/1999 | Kurita et al. |
| 6,343,129 B1 | 1/2002 | Pelrine et al. |
| 6,376,971 B1 | 4/2002 | Pelrine et al. |
| 6,543,110 B1 | 4/2003 | Pelrine et al. |
| 6,545,384 B1 | 4/2003 | Pelrine et al. |
| 6,583,533 B2 | 6/2003 | Pelrine et al. |
| 6,586,859 B2 | 7/2003 | Kornbluh et al. |
| 6,617,759 B1 | 9/2003 | Zumeris et al. |
| 6,628,040 B2 | 9/2003 | Pelrine et al. |
| 6,664,718 B2 | 12/2003 | Pelrine et al. |
| 6,707,236 B2 | 3/2004 | Pelrine et al. |
| 6,768,246 B2 | 7/2004 | Pelrine et al. |

(Continued)

FOREIGN PATENT DOCUMENTS

WO    WO 02/37660 A1    5/2002

(Continued)

OTHER PUBLICATIONS

Kornbluh, R., et al., "Electroactive polymers: An emerging technology for MEMS," (invited) in *MEMS/MOEMS Components and Their Applications*, eds. S. Janson, W. Siegfried, and A. Henning., Proc., *SPIE*, 5344:13-27, 2004.

(Continued)

*Primary Examiner*—Mark Budd
(74) *Attorney, Agent, or Firm*—Levine Bagade Han LLP

(57) ABSTRACT

Electroactive polymer transducers are disclosed. They are biased in a manner that provides for increased force and/or stroke output, thereby offering improved work potential and power output capacity. The biasing may offer additional or alternate functional advantage in terms of matching transducer performance with a given application such as a normally-closed valve. The improved biasing (including increased output biasing) may utilize negative spring rate biasing and/or a combination of negative or zero-rate biasing with positive rate biasing to achieve the desired ends.

20 Claims, 27 Drawing Sheets

U.S. PATENT DOCUMENTS

| | | |
|---|---|---|
| 6,781,284 B1 | 8/2004 | Pelrine et al. |
| 6,806,621 B2 | 10/2004 | Heim et al. |
| 6,809,462 B2 | 10/2004 | Pelrine et al. |
| 6,812,624 B1 | 11/2004 | Pei et al. |
| 6,876,135 B2 | 4/2005 | Pelrine et al. |
| 6,882,086 B2 | 4/2005 | Kornbluh et al. |
| 6,891,317 B2 | 5/2005 | Pei et al. |
| 6,911,764 B2 | 6/2005 | Pelrine et al. |
| 6,940,211 B2 * | 9/2005 | Pelrine et al. ............... 310/330 |
| 7,034,432 B1 | 4/2006 | Pelrine et al. |
| 7,037,270 B2 | 5/2006 | Seward |
| 7,049,732 B2 * | 5/2006 | Pei et al. .................... 310/365 |
| 7,052,594 B2 | 5/2006 | Pelrine et al. |
| 7,062,055 B2 | 6/2006 | Pelrine et al. |
| 7,064,472 B2 | 6/2006 | Pelrine et al. |
| 7,115,092 B2 * | 10/2006 | Park et al. ................... 600/143 |
| 7,144,616 B1 | 12/2006 | Unger et al. |
| 7,166,953 B2 | 1/2007 | Heim et al. |
| 7,199,501 B2 | 4/2007 | Pei et al. |
| 7,211,937 B2 | 5/2007 | Kornbluh et al. |
| 7,224,106 B2 | 5/2007 | Pei et al. |
| 7,233,097 B2 | 6/2007 | Rosenthal et al. |
| 7,237,524 B2 | 7/2007 | Pelrine et al. |
| 7,321,185 B2 * | 1/2008 | Schultz ....................... 310/368 |
| 7,362,032 B2 * | 4/2008 | Pelrine et al. ............... 310/309 |
| 2003/0214199 A1 | 11/2003 | Heim et al. |
| 2004/0046739 A1 | 3/2004 | Gettemy |
| 2004/0124738 A1 | 7/2004 | Pelrine et al. |
| 2005/0085693 A1 | 4/2005 | Belson et al. |
| 2005/0157893 A1 | 7/2005 | Pelrine et al. |
| 2005/0206271 A1 | 9/2005 | Higuchi et al. |
| 2006/0113878 A1 | 6/2006 | Pei et al. |
| 2006/0119225 A1 | 6/2006 | Heim et al. |
| 2006/0158065 A1 | 7/2006 | Pelrine et al. |
| 2006/0208609 A1 | 9/2006 | Heim |
| 2006/0208610 A1 | 9/2006 | Heim |
| 2006/0238066 A1 | 10/2006 | Pelrine et al. |
| 2007/0164641 A1 | 7/2007 | Pelrine et al. |

FOREIGN PATENT DOCUMENTS

| | | |
|---|---|---|
| WO | WO 02/37892 A2 | 5/2002 |
| WO | WO 03/056274 A1 | 7/2003 |
| WO | WO 03/056287 A1 | 7/2003 |
| WO | WO 2004/027970 A1 | 4/2004 |
| WO | WO 2004/053782 A1 | 6/2004 |
| WO | WO 2004/074797 A1 | 9/2004 |
| WO | WO 2004/093763 A1 | 11/2004 |
| WO | WO 2006/102273 A2 | 9/2006 |

OTHER PUBLICATIONS

Kornbluh, R., et al., "Electroelastomers: Applications of dielectric elastomer transducers for actuation, generation and smart structures," *Smart Structures and Materials 2002: Industrial and Commercial Applications of Smart Structures Technologies*, ed., A. McGowan, *Proc. SPIE*, 4698:254-270, 2002.

Kornbluh, R., et al., "Shape control of large lightweight mirrors with dielectric elastomer actuation," *Actuation Smart Structures and Materials 2003: Electroactive Polymer Actuators and Devices*, ed. Y. Bar-Cohen, *Proc. SPIE*, 5051, 2003.

Pelrine, R., et al., "Applications of dielectric elastomer actuators," (invited paper) in *Smart Structures and Materials 2001: Electroactive Polymer Actuators and Devices*, ed., Y. Bar Cohen, *Proc. SPIE*, 4329:335-349, 2001.

* cited by examiner

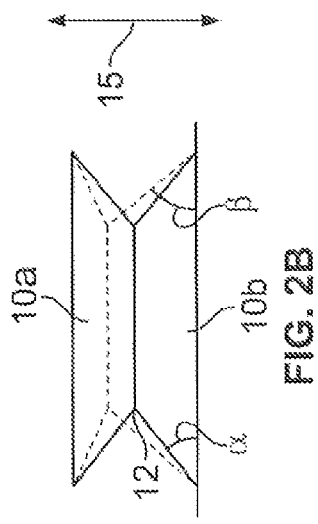
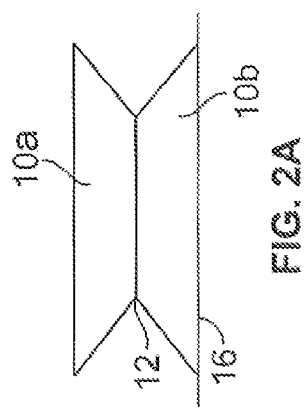
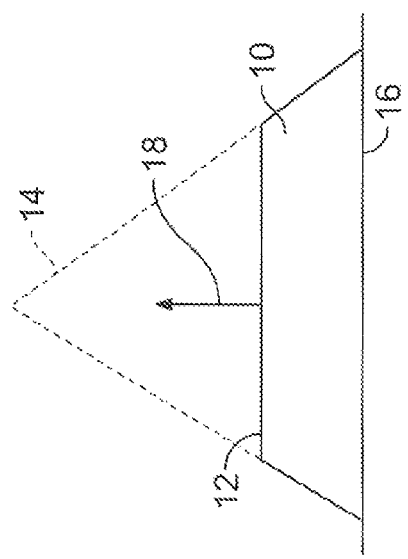
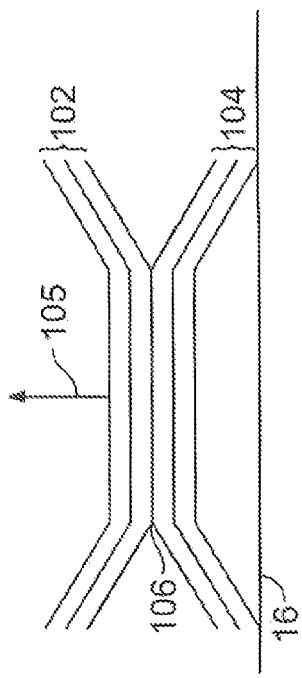
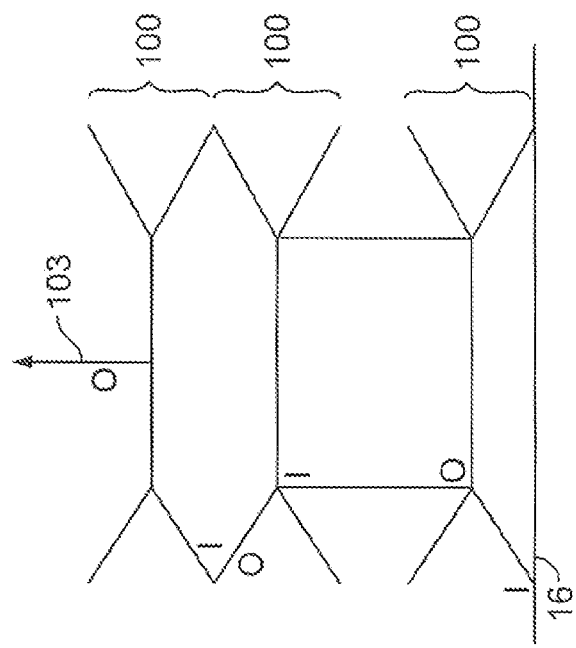
FIG. 1
FIG. 2A
FIG. 2B
FIG. 3A
FIG. 3B

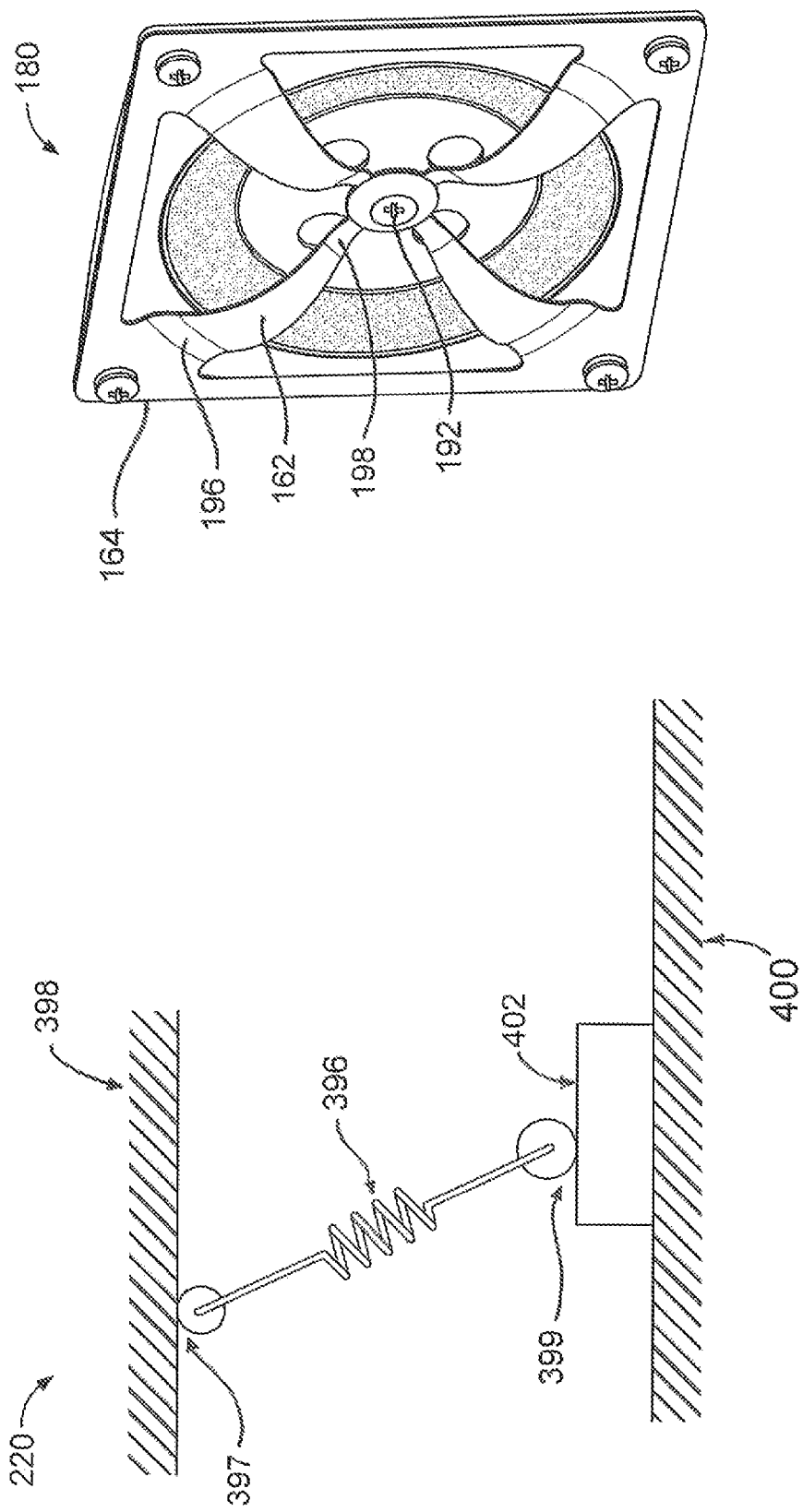

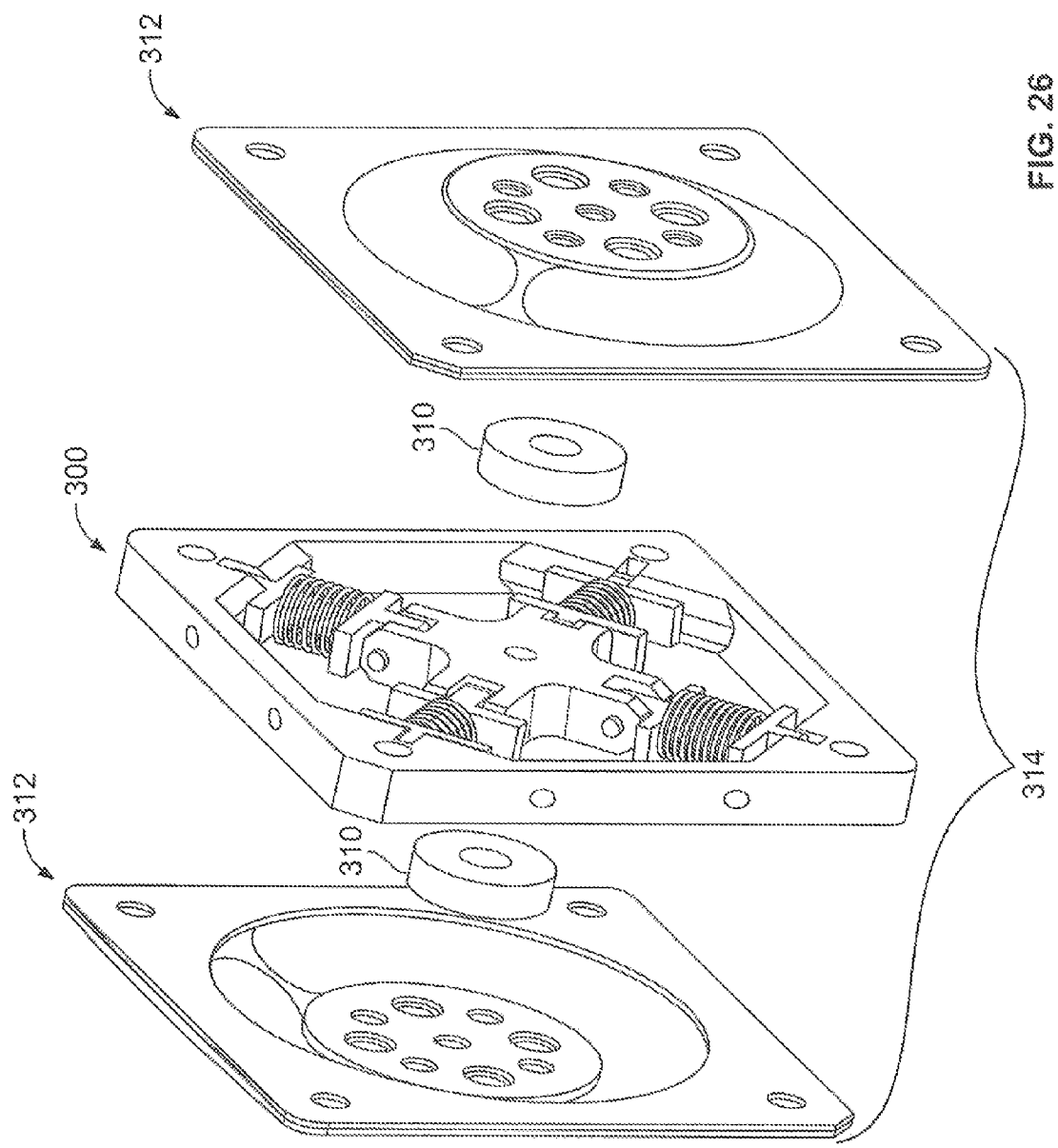

ELECTROACTIVE POLYMER TRANSDUCERS BIASED FOR INCREASED OUTPUT

FIELD OF THE INVENTION

The invention is related to electroactive polymer transducers and optimizing their performance by selectively biasing their electroactive polymer films.

BACKGROUND OF THE INVENTION

A tremendous variety of devices used today rely on actuators of one sort or another to convert electrical energy to mechanical energy. The actuators "give life" to these products, putting them in motion. Conversely, many power generation applications operate by converting mechanical action into electrical energy. Employed to harvest mechanical energy in this fashion, the same type of actuator may be referred to as a generator. Likewise, when the structure is employed to convert physical stimulus such as vibration or pressure into an electrical signal for measurement purposes, it may be referred to as a transducer. Yet, the term "transducer" may be used to generically refer to any of the devices. By any name, a new class of components employing electroactive polymers can be configured to serve these functions.

Especially for actuator and generator applications, a number of design considerations favor the selection and use of advanced electroactive polymer technology based transducers. These considerations include potential force, power density, power conversion/consumption, size, weight, cost, response time, duty cycle, service requirements, environmental impact, etc. Electroactive Polymer Artificial Muscle (EPAM™) technology developed by SRI International and licensee Artificial Muscle, Inc. excels in each of these categories relative to other available technologies. In many applications, EPAM™ technology offers an ideal replacement for piezoelectric, shape-memory alloy (SMA) and electromagnetic (EM) devices such as motors and solenoids.

As an actuator, EPAM™ technology operates by application of a voltage across two thin elastic film electrodes separated by an elastic dielectric polymer, such as silicone or acrylic. When a voltage difference is applied to the electrodes, the oppositely-charged members attract each other producing pressure upon the polymer therebetween. The pressure pulls the electrodes together, causing the dielectric polymer film to become thinner (the z-axis component shrinks) as it expands in the planar directions (the x- and y-axes of the polymer film grow). Another factor drives the thinning and expansion of the polymer film. The like (same) charge distributed across each elastic film electrode causes the conductive particles embedded within the film to repel one another expanding the elastic electrodes and dielectric attached polymer film.

Using this "shape-shifting" technology, Artificial Muscle, Inc. is developing a family of new solid-state devices for use in a wide variety of industrial, medical, consumer, and electronics applications. Current product architectures include: actuators, motors, transducers/sensors, pumps, and generators. Actuators are enabled by the action discussed above. Generators and sensors are enabled by virtue of changing capacitance upon physical deformation of the material.

Artificial Muscle, Inc. has introduced a number of fundamental "turnkey" type devices that can be used as building blocks to replace existing devices. Each of the devices employs a frame structure to support the EPAM™ film whereby application of a voltage shifts the position of the device assembly back and forth. The film can be engaged with (e.g., stretched by) the frame in such a way so as to pre-strain the film. It has been observed that pre-straining improves the dielectric strength of the polymer, thereby offering improvement for conversion between electrical and mechanical energy by allowing higher field potentials.

By varying the frame configuration and the manner in which the EPAM™ material is supported by the frame, different types of actuators can be provided to address many types of applications. Non-limiting examples of actuator types include linear actuators, bending beam actuators, planar actuators, diaphragm actuators, etc.

Linear actuators, often referred to as "spring roll" actuators, are prepared by wrapping layers of EPAM™ material around a helical spring. The EPAM™ material is connected to caps/covers at the ends of the spring to secure its position. The body of the spring supports a radial or circumferential pre-strain on the EPAM™ while lengthwise compression of the spring offers axial pre-strain. Voltage applied causes the film to squeeze down in thickness and relax lengthwise, allowing the spring (hence, the entire device) to expand. By forming electrodes to create two or more individually addressed sections around the circumference, electrically activating one such section causes the roll to extend and the entire structure to bend away from that side.

Bending beam actuators are formed by affixing one or more layers of stretched EPAM™ material along the surface of a beam. As voltage is applied, the EPAM™ material shrinks in thickness and grows in length. The growth in length along one side of the beam causes the beam to bend away from the activated layer(s).

Another class of devices situates one or more film sections in a substantially planar frame structure. In one variation of planar-type actuators, the frame includes closed linkages or spring-hinges. When a linkage frame is employed, a biasing spring may generally be employed to pre-strain the EPAM™ film. A spring-hinge structure may inherently include the requisite biasing. In any case, the application of voltage will alter the frame or linkage configuration, thereby providing the mechanical output desired within the planar directions defined by the frame structure.

Diaphragm actuators are similarly constructed to the above-described planar actuators, but provide mechanical output outside the physical plane of the frame structure. In many embodiments, diaphragm actuators are made by stretching EPAM™ film over an opening in a rigid frame. Diaphragm actuators can displace volume, making them suitable for use as pumps or loudspeakers, etc.

More complex actuators can also be constructed. "Inchworm" and rotary output type devices are examples of such. Further description and details regarding the above-referenced devices as well as others may be found in the following patents, patent application publications and/or currently unpublished patent applications:

U.S. Pat. No. 7,064,472 Electroactive Polymer Devices for Moving Fluid

U.S. Pat. No. 7,052,594 Devices and Methods for Controlling Fluid Flow Using Elastic Sheet Deflection U.S. Pat. No. 7,049,732 Electroactive Polymers U.S. Pat. No. 7,034,432 Electroactive Polymer Generators U.S. Pat. No. 6,940,221 Electroactive Polymer Transducers and Actuators U.S. Pat. No. 6,911,764 Energy Efficient Electroactive Polymers and Electroactive Polymer Devices U.S. Pat. No. 6,891,317 Rolled Electroactive Polymers U.S. Pat. No. 6,882,086 Variable Stiffness Electroactive Polymer Systems U.S. Pat. No. 6,876,135 Master/slave Electroactive Polymer Systems
U.S. Pat. No. 6,812,624 Electroactive polymers
U.S. Pat. No. 6,809,462 Electroactive polymer sensors
U.S. Pat. No. 6,806,621 Electroactive polymer rotary motors
U.S. Pat. No. 6,781,284 Electroactive polymer transducers and actuators
U.S. Pat. No. 6,768,246 Biologically powered electroactive polymer generators
U.S. Pat. No. 6,707,236 Non-contact electroactive polymer electrodes
U.S. Pat. No. 6,664,718 Monolithic electroactive polymers
U.S. Pat. No. 6,628,040 Electroactive polymer thermal electric generators
U.S. Pat. No. 6,586,859 Electroactive polymer animated devices
U.S. Pat. No. 6,583,533 Electroactive polymer electrodes
U.S. Pat. No. 6,545,384 Electroactive polymer devices
U.S. Pat. No. 6,543,110 Electroactive polymer fabrication
U.S. Pat. No. 6,376,971 Electroactive polymer electrodes
U.S. Pat. No. 6,343,129 Elastomeric dielectric polymer film sonic actuator
2006/0119225 Electroactive polymer motors
2005/0157893 Surface deformation electroactive polymer transducers
2004/0263028 Electroactive polymers
2004/0217671 Rolled electroactive polymers
2004/0124738 Electroactive polymer thermal electric generators
2004/0046739 Pliable device navigation method and apparatus
2002/0175598 Electroactive polymer rotary clutch motors
2002/0122561 Elastomeric dielectric polymer film sonic actuator Each of these documents is incorporated herein by reference in its entirety for the purpose of providing background and/or further detail regarding underlying technology and features as may be used in connection with or in combination with the aspects of present invention set forth herein.

More complex frame structures have also been developed by the assignee hereof with an eye towards producing more practical and versatile actuator structures. In this regard, frustum-shaped diaphragm actuators are ideal. These are formed by providing a centrally disposed "cap" or disc on the electroactive film of a standard diaphragm type-actuator and then displacing the diaphragm/cap in a direction perpendicular to the plane defined by the frame structure. As such, the cap provides a mechanical preloaded element.

The frustum diaphragm structure is highly practical and advantageous for a variety of applications, including but not limited to pumps, valves, camera lens, light reflectors, speaker diaphragms, multi-axis position sensors/joysticks, vibrators, haptic or force feedback control devices, multi-axis actuators, etc. These frustum-type actuators or more thoroughly described in U.S. patent application Ser. Nos. 11/085,798 and 11/085,804, incorporated by reference in their entirety.

Many of the above-described actuators have configurations which involve push-pull inputs and/or outputs which are in-plane and/or out-of-plane in only two-dimensions. However, more complex frame structures can be employed to provide three-dimensional action. One such example is found in U.S. patent application Ser. No. 11/085,798 in which a saddle-shaped actuator is used to produce a three-dimensional output. More particularly, the actuator is coupled to a pair of "wings" to offer a structure having an output which substantially mimics the flapping wings of a flying bird or bat.

Other complex actuator structures involve the coupling together or "stacking" of two or more actuators to provide two-phase output action and/or to amplify the output for use in more robust applications. The actuators of the resulting structure may all have the same configuration (e.g., all have diaphragm structures) or may have configurations different from each other (e.g., diaphragm and spring roll combination). With any configuration, activating opposite sides of the actuator system makes the assembly rigid at a neutral point. So-configured, the actuators act like the opposing bicep and triceps muscles that control movements of the human arm. Alternatively, two actuators arranged in series offers the potential to double the output in a single direction. U.S. patent application Ser. Nos. 11/085,798 and 11/085,804 disclose such "stacked" actuators.

Biasing against the film is employed to insure that the film moves in a desired direction rather than simply wrinkle upon electrode activation that causes the material to expand. Known biasing means include simple positive rate springs (such as a coil spring and leaf springs), EPAM™ film or non-active film set to pull against the biased material, by resilient foam, air pressure or a weight. U.S. patent application Ser. Nos. 11/085,798 and 11/085,804 disclose a number of such arrangements.

While the devices described above provide highly functional examples of EPAM™ technology actuators/transducers, there continues to be an interest in improving high performance EPAM™ actuators/transducers. In particular, it would be advantageous to improve force or stroke, work and, hence, power output without simply employing more electroactive polymer material. The present invention is directed at making such gains by new modes of selectively biasing the actuator film.

SUMMARY OF THE INVENTION

The electroactive polymer transducers according to the present invention are configured to be selectively biased to obtain specifically desired performance characteristics. The selection of biasing according to one aspect of the invention follows a negative bias spring model in which the spring force increases as the transducer's electroactive film moves from a preloaded position to its most highly activated position. The model may exclusively employ a negative bias spring, or may further incorporate constant force spring bias and/or a positive or "standard" spring-bias is combined with flat-rate or negative rate biasing. The biasing devices may additionally include biasing components of any of a coil spring, leaf spring, air or fluid pressure biasing, etc. or a combination of any of these means or the like, are also contemplated within the present invention.

In addition to predictive modeling and implementation of desirable biasing rates/profiles, the invention also includes novel spring configurations. One such configuration comprises a "buckled" type of beam spring. One or more such members may be provided in a bi-stable leaf-spring arrangement. However configured, the spring operates by progressively compressing an "S" or "C" shaped member. Another spring type comprises a polymeric (preferably molded rubber) bias diaphragm. The active spring portion of such an element may also take an "S" or "C" shaped form. The diaphragm may provide biasing, alone, or offer additional utility as a baffle wall within a valve body, as all or a portion of a pump diaphragm surface, etc. Yet another spring configuration suitable for negative rate biasing is provided in the form of a cartridge in which one or more compression springs are constrained by the geometry of a linkage.

Still other implementations are possible. For example, a simply loaded beam or leaf spring may be employed to generate a negative or substantially flat bias rate by virtue of material selection. Specifically, superelastic NiTi (or another superelastic material—including polymers) that exhibit pseudoelastic deformation and recovery may be employed.

The present invention further includes methodologies for selectively biasing an electroactive polymer transducer, methods for performing actuations and the like with the subject electroactive transducers and methods of using the subject transducers for various applications. Without identifying each and every application in which the subject transducers may be employed, a non-exhaustive list includes actuators, motors, generators, pumps, valves, sensors, etc.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings. To facilitate understanding, the same reference numerals have been used (where practical) to designate similar elements that are common to the drawings. Included in the drawings are the following:

FIG. 1 diagrammatically illustrates the geometry of a single-sided frustum-shaped transducer;

FIGS. 2A and 2B diagrammatically illustrate the geometry and function of a double-sided frustum-shaped transducer;

FIGS. 3A and 3B diagrammatically illustrate the geometry of transducer assemblies of stacked double-sided frustum-shaped transducers in serial and parallel configurations, respectively;

FIG. 15A illustrates a schematic illustration of Belville Washer model with a component-to-component comparison with the device of FIG. 13A.

FIG. 26 is an assembly view of a double-frustum EPAM transducer incorporating a negative rate bias cartridge;

Variation of the invention from that shown in the figures is contemplated.

DETAILED DESCRIPTION OF THE INVENTION

The devices, systems and methods of the present invention are now described in detail with reference to the accompanying figures. While the subject electroactive polymer transducers may have any suitable construct, for purposes of this description, frustum-shaped transducers are particularly described and illustrated; however, those skilled in the art will recognize other architectures suitable for use with the present invention. The transducers described, as well as such others as noted above may be incorporated in the biasing approaches taught by the present invention. In other words, the present invention includes, but is not limited to, known EPAM architectures with the addition of biasing as described below. The present invention further contemplates the use of known electroactive polymer architectures together with biasing components as described herein.

The frustum architecture of the subject EPAM™ transducers yields improved output as compared to a strictly flat or planar architecture. Not to be bound by a particular theory, but it is believed that this result stems from use of a substantial portion or nearly all of the available EPAM™ diaphragm material expansion that occurs upon activation of the transducer. Stated otherwise, this type of transducer derives its z-axis output from both the x and y components of film expansion.

FIGS. 1-3 diagrammatically illustrate the "frustum" shape of the transducers of the present invention. In a simplified two dimensional model, as shown in FIG. 1, a frustum-shape is defined by a truncated conical or pyramid-like body or structure 10, whose top or narrow end 14 (in phantom) (relative to an opposite broader end 16 defining a reference plane) has been removed to define a flat surface 12. This model profiles a "single-sided" transducer structure while FIGS. 2A, 2B, 3A and 3B profile "double-sided" transducer structures, where the latter are formed by "stacking" together two or more single-sided and/or double-sided structures. Various examples of each of these frustum-shaped transducers are now described.

Figure 4:
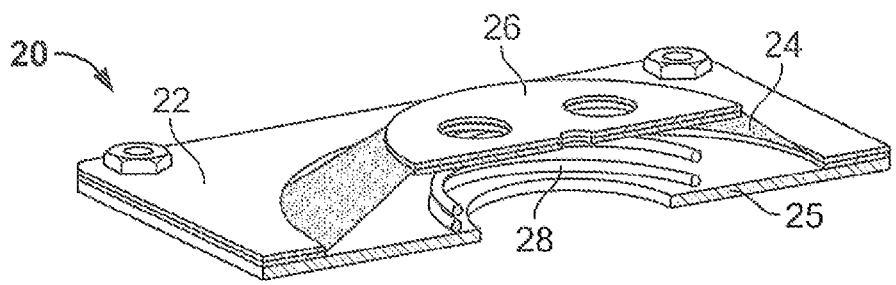
FIG. 4 provides a perspective cross-sectional view of a single-sided frustum-shaped transducer having an EPAM diaphragm that is biased by a coil spring.

FIG. 4 illustrates a perspective cross-sectional view of a single-sided frustum-shaped transducer 20 having an EPAM™ diaphragm or film 24 held by a frame 22 (having a square outer profile, for example) with, a capping structure 26 affixed or positioned centrally to the diaphragm. A baffle wall 25 associated with the frame 22 (or part of the frame itself) whereby film 24 is sandwiched therebetween in a stretched or tensioned condition. Similarly, cap 26 may be comprised of two opposing sides which sandwich diaphragm 22 therebetween. Alternatively, the capping structure may comprise a portion of the diaphragm which is made substantially more rigid through thermal, mechanical or chemical techniques (e.g., vulcanizing).

Generally, the capping section of the transducers of the present invention will be sized to produce a perimeter of sufficient dimension/length to adequately distribute stress applied to the material. The ratio of the size of the cap to the diameter of the frame holding the EPAM™ layers may vary. The size of the cap will be larger under higher stress/force application. The degree of truncation of the structure is of further importance, particularly where the aggregate volume or space that the transducer occupies is required to be as small as possible.

Depending on the application, desirable cross-sectional geometries of capping structures usable with the present invention include disc-shaped, circular, triangular, square, pentagonal, hexagonal, etc. Often, symmetrically shaped end or cap members will be desirable from the perspective of consistent material performance. However, ovaloid, oblong, rectangular or other shapes may prove better for a given application—especially those that are space-constrained. Further variation is contemplated in that the truncated or capped ends need not be flat or planer. Additionally, in certain applications, a point-loaded diaphragm forming a coned-shaped structure or a pressure-biased dome, etc., may be used. These structural features/physical characteristics may have particular significance where the capping surface or diaphragm element is designed to serve as an active component (such as a valve seat, etc.).

Referring again to FIG. 4, when cap 26 is biased or preloaded in a direction (identified by arrow 18 in FIG. 1) perpendicular to the plane defined by the cap/frame, film 22 is stretched out of the plane, thereby providing the profile illustrated in FIG. 1. Here, capping structure 26 is preloaded or biased by a coil spring 28 interposed between frame 22 and baffle wall 25. Coil spring 28 exhibits a positive rate spring effect against cap 26. Namely, spring force against the capping structure is substantially as represented by $F=k(x)$, where F represents force, x represents spring displacement, and k is the rate of the spring.

As discussed above, when the electroactive polymer is energized, it expands. This allows the preloaded spring to relax to delivery actuator/transducer stroke. Upon lowering (or terminating) voltage application, the electroactive polymer recovers to compress the spring until the opposing forces equilibrate. The overall actuator is, thus, in its most stable position when activated, whereas the spring itself is stable in its uncompressed position.

In double-sided frustum transducers, two or more transducers are coupled together to form a transducer assembly. In the most basic of double-frustum transducers, i.e., as illustrated in the profile model of FIGS. 2A and 2B, two transducers 10a, 10b are stacked with their capped surfaces held together under tension to produce concave forms facing opposite or away from one another where one side of the transducer assembly typically provides preload to the other.

Figure 5:
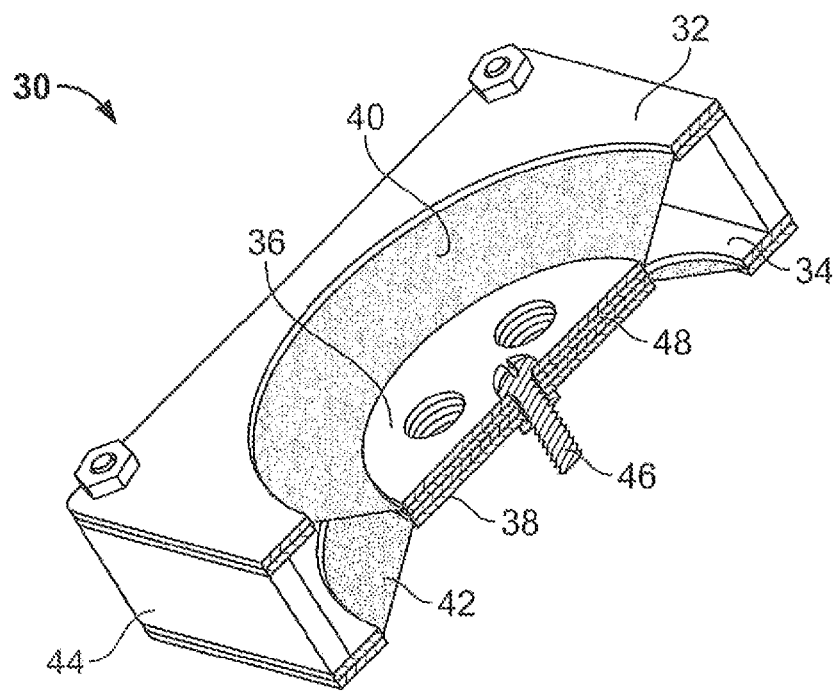
FIG. 5 provides a perspective cross-sectional view of a single cartridge stack 2-phase film biased transducer assembly having an EPAM diaphragm that is conventionally biased.

FIG. 5 illustrates a transducer assembly 30 having the profile illustrated in FIGS. 2A and 2B. Here, a body frame 44 is employed to which each of the two transducer frames 32, 34 are mounted by way of nut and bolt members 50. The respective transducer capping structures 36, 38 are secured to one another, such as by a nut and bolt assembly, along an interface section 48. The interface section 48 may offer a relatively stiffer or less flexible capping region than that which is possible with single-sided transducers.

Transducer assembly 30 operates as shown in FIG. 2B. With the cap or interface section 12 defining a stable top/bottom surface, the attached EPAM™ diaphragms 10a, 10b of the structure assume an angle with respect to the frame or reference plane 16. When the assembly (or a transducer side) is inactive, the angle α that each diaphragm forms with its respective frame or reference plane 16 may range between about 15 and about 85 degrees. More typically it will range from about 30 to about 60 degrees. When a transducer side/diaphragm 10b is energized, it relaxes and pulls with less force, allowing elastic recovery of the other transducer side/diaphragm 10a, thereby producing work through force and stroke of the device. Such action, indicated by the dashed line in FIG. 2B, increases the depth of one cavity while decreasing that of the other. When voltage is applied so that the EPAM™ material is compressed and grows in its planar dimensions, it assumes a second angle β from about 5 to about 15 degrees greater than angle α. Optimum angle ranges will vary based on application specifications.

The double-sided transducer assemblies may be configured where one or both of the transducer sides 10a/10b are active. With just one active side, i.e., a single-phase transducer, forced motion is limited to one side of the neutral position, with the inactive side functioning as solely as a preload for the other (simply offering a replacement for coil spring 28 in the first referenced embodiment). Where both diaphragms comprise EPAM™ film, i.e., a double-phase transducer, then the actuator can move in/out or up/down relative to a neutral position, as indicated by double-headed arrow 15. In the latter configuration, each side may act as a preload or bias for the other with or without other means of biasing/preload. Whether the double-sided transducers assemblies are single-phase or double-phase, the resulting net bias exhibited is conventional (i.e., it behaves as a positive rate spring with which the bias force decreases as the travel distance ("stroke") of the biased side of the transducer increases). Stated otherwise, spring preload force at its highest when the actuator is in its neutral/stable or de-energized position.

The transducer assemblies optionally employed in the present invention may have any number of diaphragm layers held in a stacked configuration. The stacking may have a "serial" or "parallel" configuration or a combination of the two. FIGS. 3A and 3B illustrate profile models of stacked serial and parallel transducer assemblies, respectively.

In FIG. 3A the profile shows individual transducers placed in alternating directions, i.e., every other transducer diaphragm is placed with its concave (or convex) side facing in the same direction. More particularly, six individual frustum-shaped diaphragms are employed in three pairs of double-sided transducer assemblies 100 where their adjacent frame structures ganged together. One side of the entire assembly is braced against a reference support 16. The purpose of such an arrangement is to connect the output of the first actuator (its cap/disc) to the input of the second actuator (also its cap/disc) while providing clearance for the relative movement of their outer frames. With each additional transducer pair 100, and without increasing the force needed (i.e., keeping it constant), the overall or total stroke potential increases by a factor of 1 in the biased direction indicated by arrow 103.

In FIG. 3B, the profile model of a parallel-configured transducer assembly is illustrated where the frustum diaphragms on one side 102 of the assembly are stacked in one direction (i.e., nested) and the frustum diaphragms on the other side 104 of the assembly are stacked or nested in the opposing direction. Sides 102 and 104 are coupled together via the interface 106 between the innermost (facing) transducer diaphragms with the stacked frame structure of one side 104 being braced against reference plane 16. Such a construction amplifies the force potential of the transducer system in the direction of arrow 105 while maintaining the same stroke as one pair. With each additional transducer pair (where one of the pair is added to each side 102, 104), and without changing the stroke of the system (i.e., keeping it constant), the total force potential increases by a factor of 1 in the biased direction indicated by arrow 103.

Figure 6:
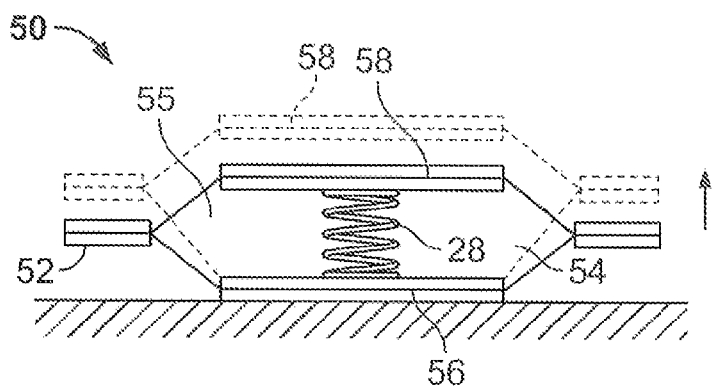
FIG. 6 provides a perspective cross-sectional view of a serially stacked, single phase transducer assembly having an EPAM diaphragm that is conventionally biased.

FIG. 6 illustrates a configuration of a serially stacked single-frustum transducer assembly 50 that may be employed with biasing according to the present invention. Here, the diaphragms 54, 55 are coupled to each other by way of frame 52 with their concave sides facing inward towards each other. One of the capping structures 56 is fixed or mounted (reference plane) while the other 58 is not, thereby providing a single-phase actuator where the "free" capping structure 58 translates twice the distance (stroke) in the biased direction (as shown in phantom) as the capping structure would otherwise in a two-phase actuator, and in which the outer frame assembly moves one-half the distance of the top disc.

Figure 7:
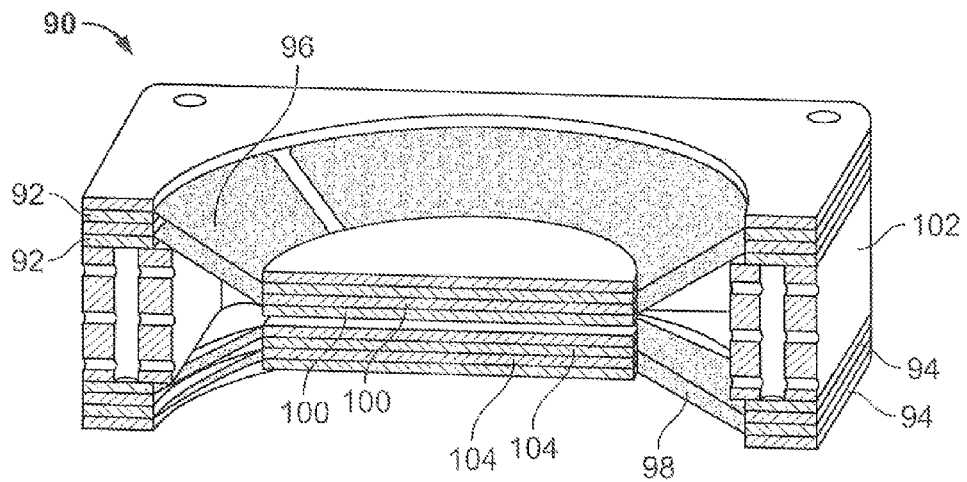
FIG. 7 provides a perspective cross-sectional view of a parallel stacked, two-phase transducer assembly having an EPAM diaphragm that is conventionally biased.

Another example of a possible construct of a parallel-stacked double-frustum transducer assembly that may be used in the present invention is illustrated in FIG. 7. Transducer assembly 90 comprises multiple double frustum transducer units having multiple diaphragm layers 96, 98 on each side of the double-frustum structure with their respective capping members 100, 104 and frame sections 92, 94 ganged or stacked together. To accommodate the increased thickness of the device, additional frame sections or one or more spacer members or layers 102 may be interposed between the transducer sides.

Figure 8:
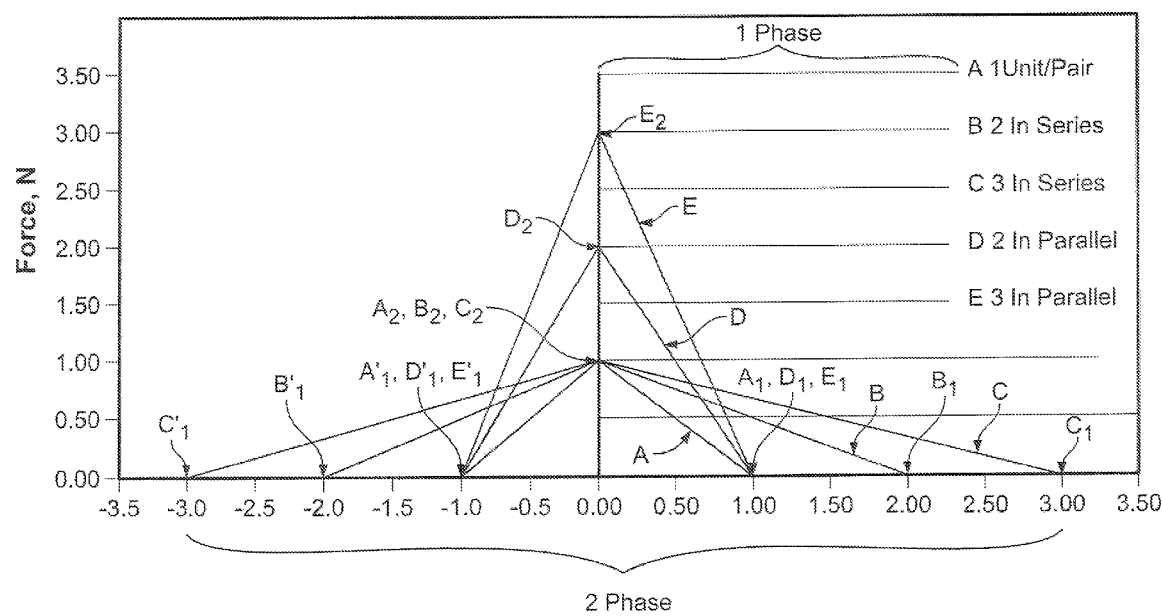
FIG. 8 is a graph plotting the force-stroke relationships of two-phase, double-sided frustum-shaped transducer assemblies having various structural configurations and which are conventionally biased.

The relative force-stroke relationships of parallel and serially constructed stacked transducers having conventional biasing characteristics are illustrated in the graph of FIG. 8. Assuming that the diaphragm transducer pairs forming the stacked assemblies are each constructed to have its capped structure(s)/interfaced surface(s) displaced or biased 1.0 mm from the reference plane/support when in the neutral or inactive position (i.e., no force applied) and to require 1.0 Newton of force to move the capped structure/interfaced surface to a stable position (i.e., no displacement), line A reflects the force-stroke relationship of a single-unit (one transducer pair) transducer assembly. In particular, the transducers are inactive at point A1 (actuator neutral/stable position) and activated at point A2 (stable position of the spring). This force-stroke relationship applies whether the conventionally-biased single-unit assembly is stacked in a parallel (FIG. 1) or series (FIG. 6) configuration. Lines B and C reflect the force-stroke relationship of serially stacked transducer assemblies having two and three pairs of transducers, respectively. Point B1 and C1 represent their respective neutral positions and points B2 and C2 represent their respective bias-member stable positions. Similarly, lines D and E reflect the force-stroke relationship of parallel-stacked transducer assemblies having two and three pairs of transducers, respectively, where points D1 and E1 represent their respective neutral positions and points D2 and E2 represent their respective bias-member stable positions. The various oppositely-directed lines and prime designations (i.e., A1', B1', C1', D1', E1') are indicative of the force-stroke relationship of the transducers in two-phase use. As mentioned previously, each additional transducer pair in the serially stacked configuration increases the stroke output of the transducer assembly without increasing the required force, while each additional transducer pair in the parallel stacked configuration increases the force output of the transducer assembly without requiring an increase in stroke.

The frustum transducers described thus far are pre-loaded/biased so as to exhibit force-stroke characteristics of a conventional or positive rate spring system, i.e., a system with a decreasing force bias enables. At least a component of such conventional biasing may be required or optimum to obtain the desired performance or output characteristics, for example, in use with a normally closed that requires a high initial preload for sealing. However, for other applications, addition of constant force bias or negative rate spring bias component may be preferred in order to improve valve adjustment range. In other applications, constant and/or negative rate spring biasing, alone, may be preferred. Each of these types of systems is described below.

Figure 9:
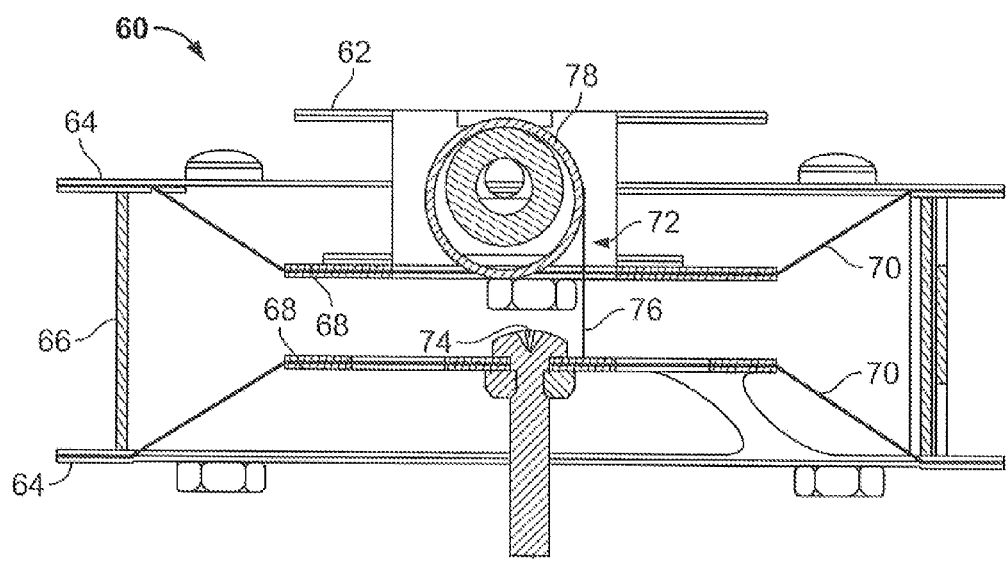
FIG. 9 provides a perspective cross-sectional view of a single-sided frustum-shaped transducer having an EPAM diaphragm that is biased with a constant force (zero rate spring) mechanism.

Referring now to FIG. 9, an example of a double frustum-shaped transducer biased to perform according to a constant force model is illustrated. Transducer 60 includes EPAM™ film 70 held about its perimeter by frame sections 64 which in turn is mounted to and spaced from a baffle wall 62. Frame support 66 separates frame sections 64, which collectively may be referred to as a frame. The upper one of the diaphragm's centrally positioned capping structure 68 has a central bore or slot 72 through which the constant-force spring 76 passes and is fixed to the grounding structure with a fastener head 74. The constant force spring is rotatably mounted on a roller 78 fixed to a bracket. The constant force (zero-spring rate) spring, also called a "negator" spring, provides a more optimum bias than the conventional rate coil spring. This improved bias allows the actuator to do more force, stroke, work, and power.

Figure 10:
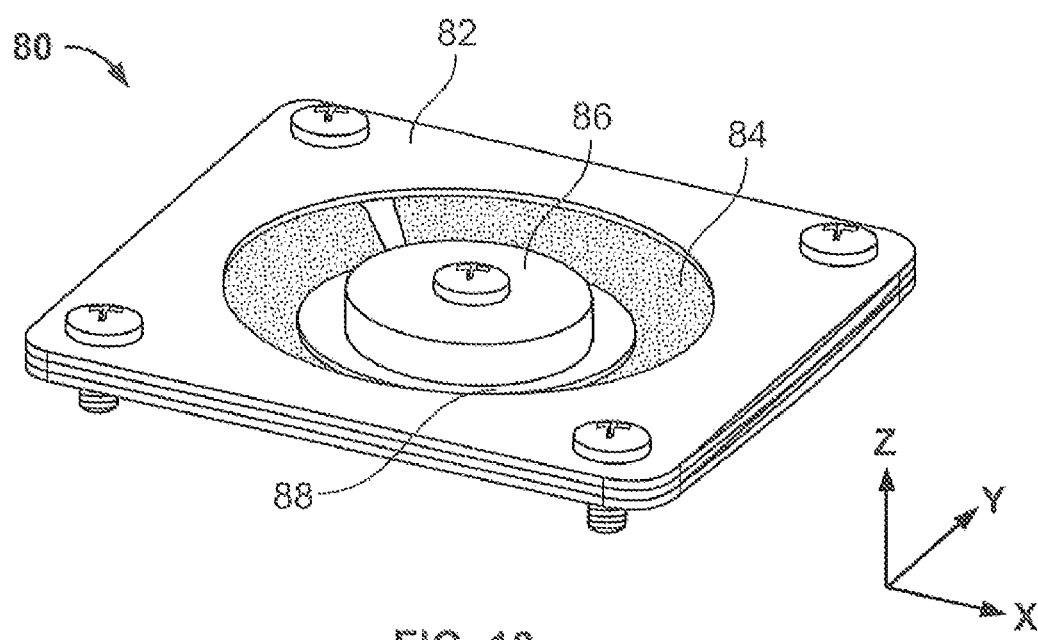
FIG. 10 provides a perspective view of a single-sided frustum-shaped transducer having an EPAM diaphragm that is biased with weighted mass.
Figure 11:
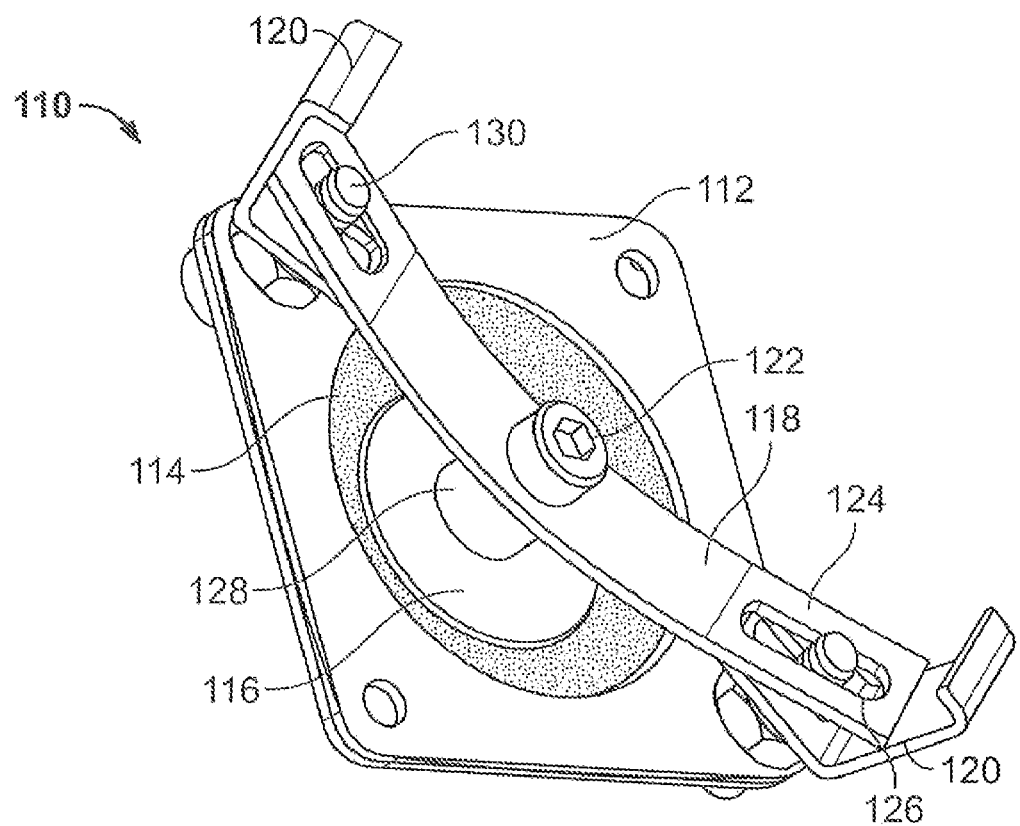
FIG. 11 provides a perspective view of a single-sided frustum-shaped transducer having an EPAM diaphragm that is biased with a leaf spring mechanism.

Another variation of a constant force biased transducer system employs a mass or weight positioned on a transducer's diaphragm. FIG. 10 illustrates a transducer assembly 80 where the EPAM™ film 84 has been biased in a direction perpendicular to frame 82 by a simple weight 86 attached to or formed integral with the cap section 88. A transducer device which is weight/mass biased will typically be position parallel relative to the ground reference plane (i.e., lie flat) so that the pull of gravity on the weight 86 symmetrically biases the transducer diaphragm 84 along a Z-axis.

While both examples offer constant (or at least substantially constant) rate biasing, the "spring" variation will sometimes be preferable because it can operate across a wide range of frequencies without significant consideration of inertial loads as inherent to a weighted biasing approach. As such, it may be better suited to actuators or other transducers in which reaction time is key and/or are intended to cycle at high frequencies.

Yet, in one mode of use, the weight/mass biased transducer 80 is especially useful in a cyclic application. More specifically, such bias member 86 may be employed to initially bias or preload diaphragm 84 in a transducer system configured to run within a given frequency range. The mass of the system may be weighted or tuned so as to offer maximum displacement at a desired frequency of operation, i.e., the frequency at which the diaphragm is caused to move. Ideally, when a constant operating frequency can be employed, the size of the mass is selected for resonance by modeling the system as a mass-spring system or mass-spring-damper mechanical system. In variable frequency applications, the transducer may be designed so that the peak performance range covers a broader section of frequencies, e.g., from about 0.1 to about 300 Hz. Such mass-tuned transducers are described in greater detail in U.S. patent application Ser. No. 11/361,703, incorporated herein by reference.

In any case, the constant or substantially constant rate biasing aspect offered by either one of the above spring types is advantageously combined with a positive or negative rate bias means as described further below. In addition, it is to be understood that other constant or substantially constant rate bias members may be employed alone or in such a fashion. A non-exhaustive listing of examples includes: pseudoelastic biasing members (e.g., as noted above) and high-volume air springs.

Various negative rate spring-biased transducers are now described in detail with respect to FIGS. 11-14. In the transducer 110 shown in FIG. 1, a leaf spring mechanism used to bias the diaphragm 114 in a direction perpendicular to frame 112. The leaf spring mechanism includes an elongated bowed member 118 (also simply referred to as a "leaf spring") having slotted end members 124. The bowed member 118 is attached to cap member 116 by a bolt 122 and a nut (not shown) with its concave surface facing away from the diaphragm. While the orientation of the leaf spring relative to the diaphragm may be at any angle, a diagonal orientation allows use of the longest spring, and therefore, undergoes the least amount of stress for the same amount of deflection. A spacer or boss 128 is captured between leaf spring 118 and cap member 116. Linkage members. 120, in the form of mounting bracket or legs, are affixed to frame 112 by way of bolts 130 where the distal end of a bolt is aligned within a corresponding slot 126 in a leaf spring end 124. The linkage members allow the necessary degree of freedom for axial displacement of bolt 122. As leaf spring 118 bows in and out, linkage members 120 rock back and forth. The orientation can be any angle but a diagonal orientation allows use of the longest spring possible which undergoes the lowest amount of stress for the same amount of deflection.

When bow member is sufficiently long, the relation of the linkage members and the bow member causes buckling of the bow member. The degree of buckling increases as the cap returns to the stable position of the actuator. Under such conditions, the net effect of the system configuration results in the elongate member serving as a negative rate spring rather than as a common leaf spring as described above. This occurs in an analogous fashion as in the structure described below.

Figure 12:
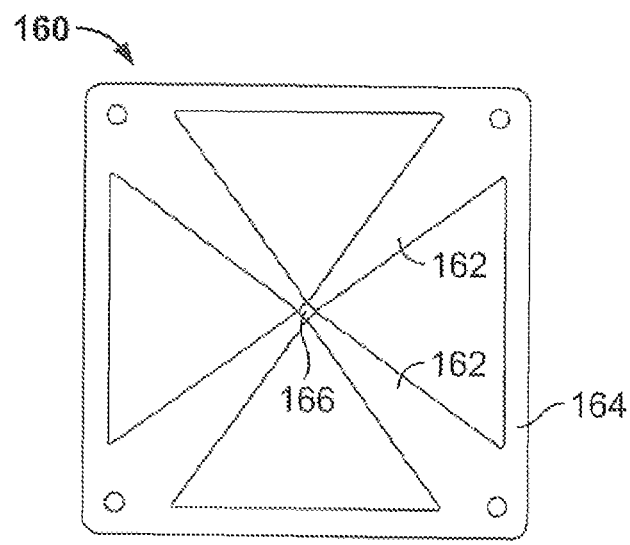
FIG. 12 provides a view of a cut-out sheet of material for producing a "clover" type negative rate spring for use in the present invention.

FIG. 12 illustrates a spring element 160 that can be configured for use as a negative spring rate biasing member. Spring element 160 comprises a number of fingers, petals or elongate members 162 which extend radially inward (at an angle) from the frame 164 to define (in this example) a "clover" shaped structure with a hole 166 where the petals may meet (but typically are not joined). However, any number of petals may be employed, most typically in a symmetrical configuration. The number of pedals linearly affects the overall stiffness and spring rate of the structure, i.e., the more pedals, the greater the overall stiffness and spring rate. Symmetry in the flexure arrangement creates a very stable centered radial support without the additional friction and complexity of sliding, rocking or rolling elements in an assembled system when employed in a transducer assembly.

The spring element itself may be stamped, punched, laser cut, etc. from any conventional elastic spring material including polymers, fiberglass, glass-filled polymer, carbon steel, stainless steel, titanium, etc. When this is the case, it will perform substantially as represented below.

Figure 13A:
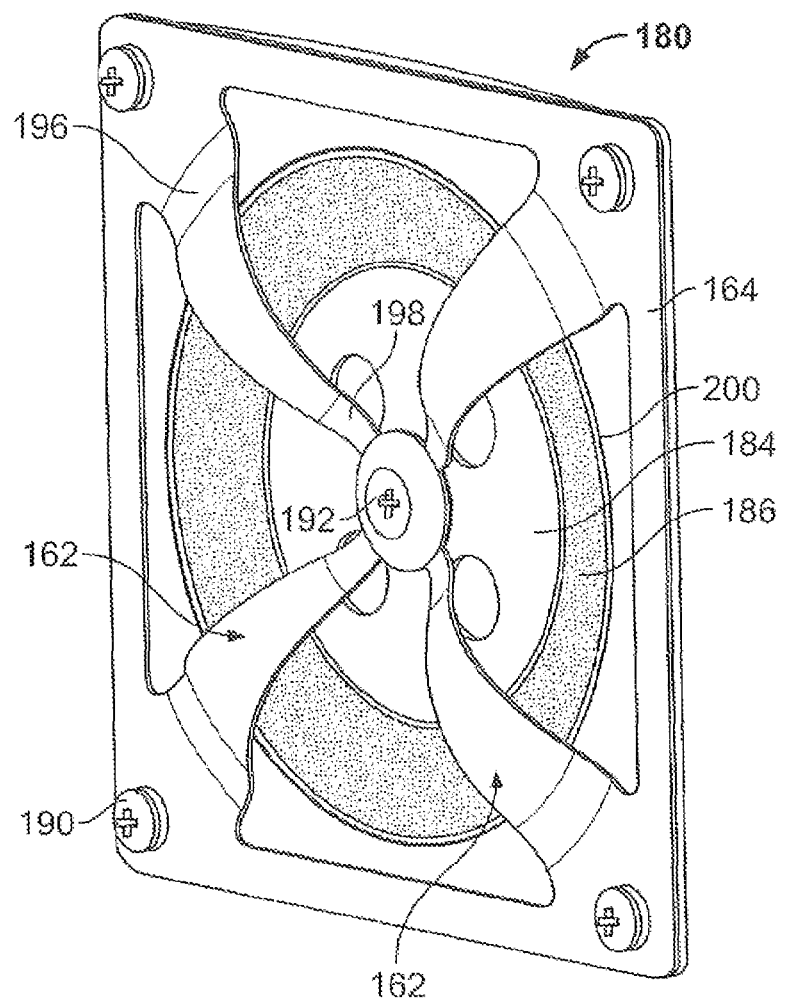
FIG. 13A provides a perspective view of a single-sided frustum-shaped transducer having an EPAM diaphragm that is biased with another type of negative rate spring bias mechanism comprising a multiple leaf spring structure constructed with the spring element shown in FIG. 12.
Figure 13B:
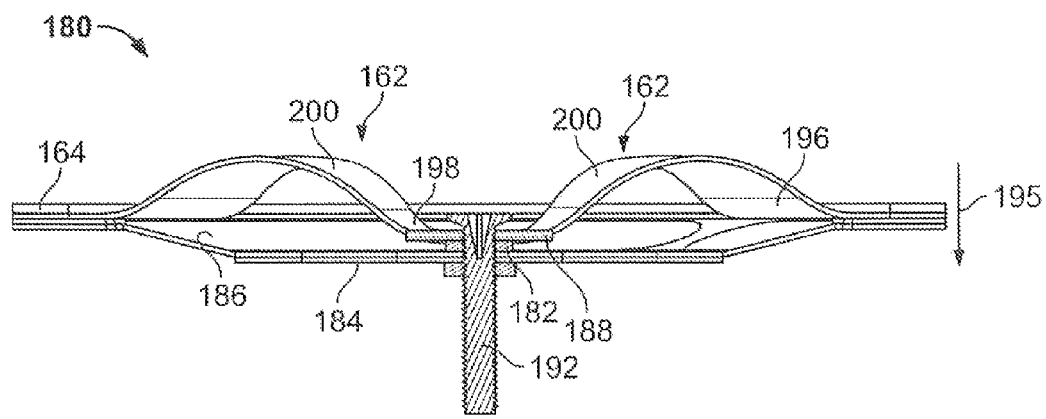
FIG. 13B shows a lateral cross-sectional view of the device of FIG. 13A taken along the section line shown.

FIGS. 13A and 13B illustrate a transducer 180 incorporating spring element 160. Here, the inwardly extending petals or fingers 162, extending from frame 164 are secured to produce a curved, S-shaped or bowed configuration. Specifically, each elongate member 162 has a base flexure portion 196 and an end flexure portion 198 with an outwardly curved central portion 200 extending therebetween. The ends of the fingers are captured and held against capping member 184 by a centrally positioned nut/bolt 192 or the like. A center disk 182 forces the ends of the fingers 162 a selected distance (larger than hole 166) from the body of the bolt 192. A washer 188 covers some portion of the finger ends.

As such, the clover petals 162 are flexed inwardly into a buckling mode of compression. The compressive force acts along a shallow angle relative to capping member 184. With high compression force, but with little mechanical advantage, diaphragm film 186 is nonetheless stretched to form the frustum architecture. So with one part, the clover leaf spring bias element provides a simple optimized bias spring and radial support for the output shaft.

Figure 14A:
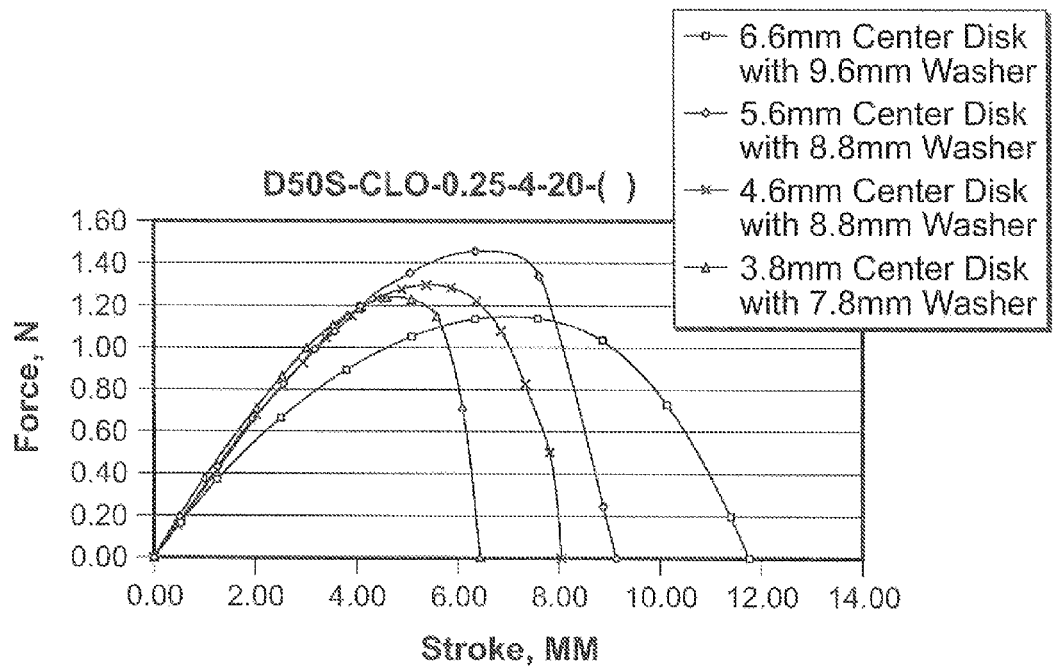
FIGS. 14A-14D are charts demonstrating tunability of the spring element in FIG. 12 as employed in a configuration resembling that shown in FIGS. 13B and 13C.
Figure 14B:
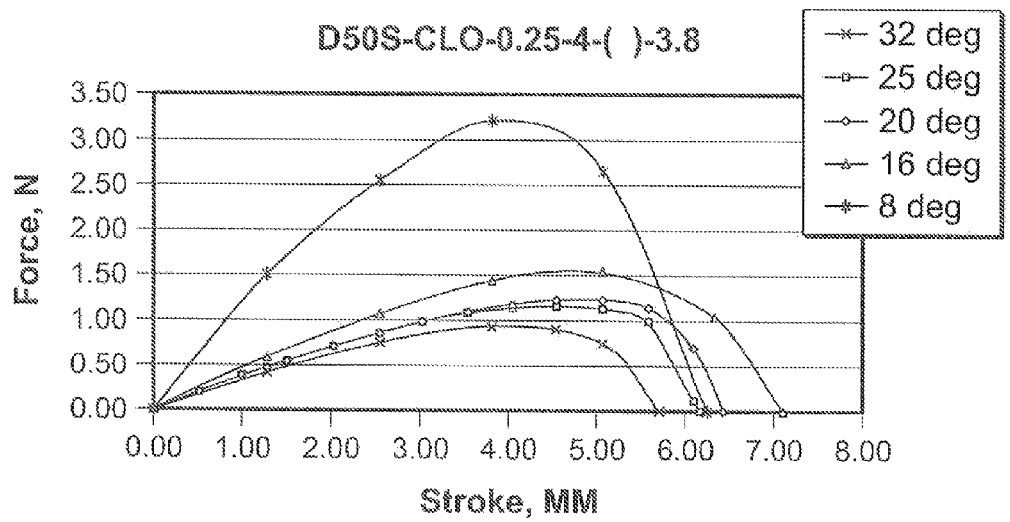
Figure 14C:
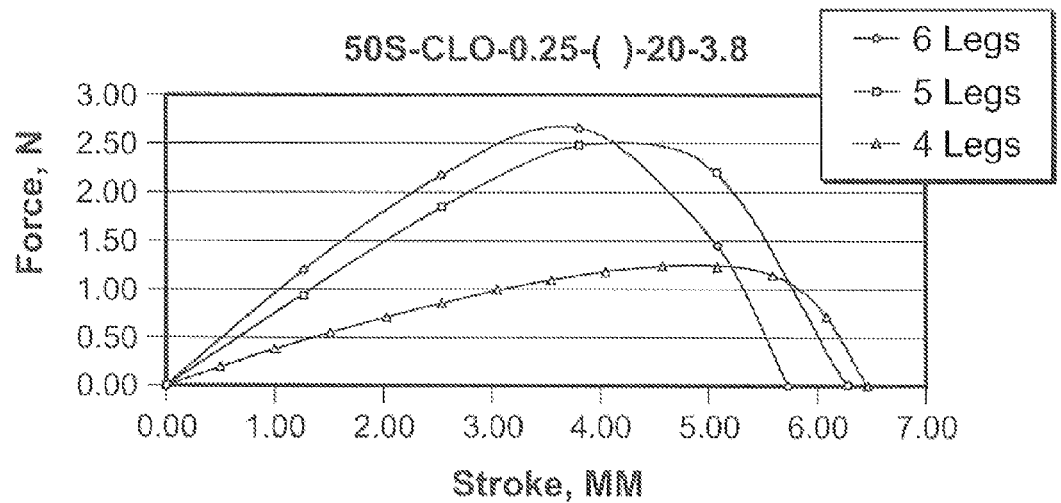
Figure 14D:
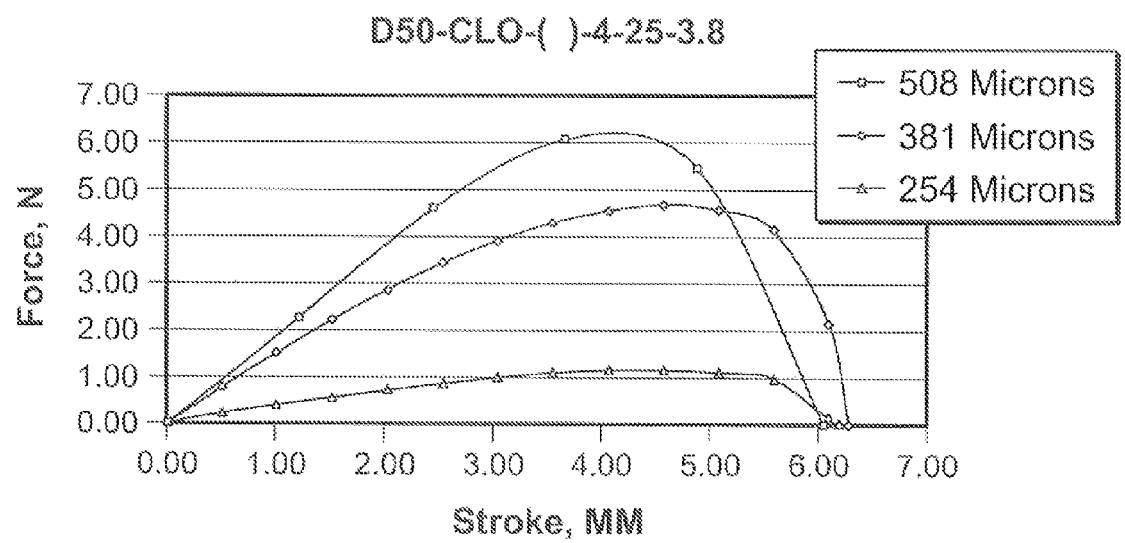

By varying the center washer diameter, spring element thickness, number of members, degree of preload compression/buckling, etc., a wide range of spring rates can be obtained. FIGS. 14A-14D illustrate such tunability. Specifically, FIG. 14A illustrates different spring rates generated by the same structure as a result of changing center disk 182 and washer 188 size. FIG. 14B illustrates the force-stroke relationship as a function of varying the included angle of the spring fingers 162. FIG. 14C illustrates the effect of adding more legs to the spring plate structure 160. FIG. 14D illustrates the effect of increasing spring member 162 thickness. As explained further below, negative spring rates are offered by such a structure.

Figure 13C:
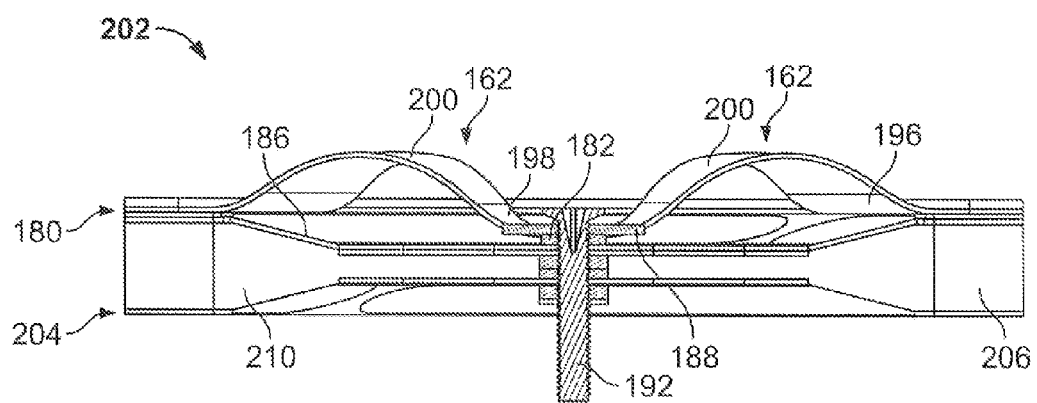
FIG. 13C shows a lateral cross-sectional view of a two-phase, double-sided frustum shaped transducer employing the multiple leaf spring mechanism shown in FIG. 13B.

Negatively biased transducers of the present invention may also be used in pairs to form double-frustum architectures. For example, FIG. 13C illustrates a cross-section of a transducer assembly 202 which includes transducer 180, operatively coupled to another frustum transducer 204 by means of a body frame 206 (similar to the manner in which body frame 44 of FIG. 5 is employed) to form a double-frustum structure with the transducers' concave sides facing away from each other. Given that the clover spring shown is a bi-stable device, it can be used in a two-phase configuration as illustrated.

The above-described negative biasing mechanism, although variously configured, function similarly in that the force (over an intended working range) that they each exert on the transducer diaphragm increases as the transducer's electroactive film moves from an inactive to a fully activated position. They behave and perform similarly to known devices that exhibit inherent bi-stable function, such as keyboard dome switches, solenoids or snap-feel devices.

Figure 15B:
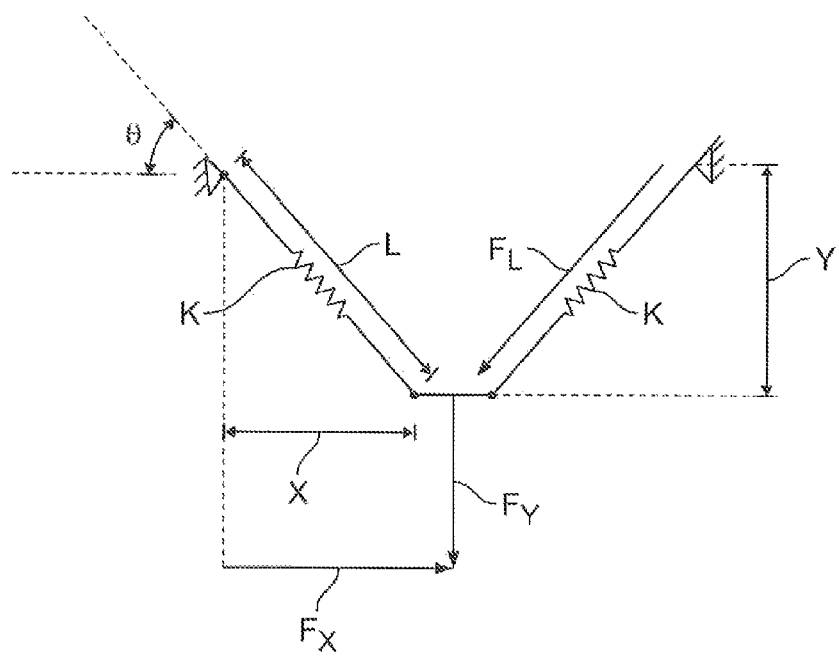
FIG. 15B diagrammatically illustrates the force and displacement variables of the model of FIG. 15A.

An understanding of the "negative rate spring" behavior referenced above may be appreciated through comparison to a Belleville Washer structure model. A feature-to-feature comparison is offered between the diagrammatic illustration of a "modified" Belleville Washer structure in FIG. 15A and the negatively biased transducer device 180 of FIGS. 13A and 13B. A Belleville Washer is symbolically illustrated in terms of a genetic coil spring (positive rate spring) and other basic cooperative components. More specifically, system 220 is defined by a coil spring 396 pivotally fixed 397 at one end to a support structure 398 and pivotally fixed 399 at the other end to a linear bearing which is linearly translatable across the ground structure 400, defining a linear bearing surface 402. The so-called "stable" position(s) of the coil spring 396 is when it is at stable equilibrium, i.e., without any compressive or tension forces exerted on it. As such, in system 220, the stable positions of the coil 396 occur when the linear bearing is at a location along the linear bearing surface 402 at which no forces are exerted on the coil spring 396. In the illustrated system, there are two such stable positions (i.e., it is bi-stable), one on each side (left and right) of the structural support pivot point 397 at which the coil spring is not under either compression or tension. When directly under the pivot and subject to maximum compression, the system is also is unstable equilibrium. On either side, adjacent this point the force of the spring drives the system to its nearest stable equilibrium position.

With these principles in mind, the component-to-component comparison illustrated in FIG. 15A between the analogous Belleville Washer structure 220 to a negatively biased transducer 180 of the present invention is as follows: the structural support 398 of the Belleville model corresponds to the transducer's frame 164, the coil spring 396 corresponds to the curved portions of the clover spring flexures collectively 162, the structural support pivot 397 corresponds to the outer flexure points collectively 196, the linear bearing pivot 399 corresponds to the inner flexure points collectively 198, and the linear bearing surface 402 corresponds to the nut/bolt 192 means used to secure the flexure ends to the cap member.

The inventors have found that the clover leaf spring does in fact function according to a negative rate spring/Belleville Washer model. This theoretical relationship is shown with reference to FIG. 15B, which is a schematic representation of two opposing clover leaf flexures. The flexures are once again schematically represented by two coil springs, each having one of their respective ends oppositely wall-mounted opposite each other and their respective "free" ends coupled together.

The following variables are represented by the illustrated model:

L is a spring length,
x is the horizontal component of the spring length L,
y is the vertical component of the spring length L,
$F_L$ is the total net force applied to the spring when a load is placed on it,
$F_x$ is the horizontal component of $F_L$,
$F_y$ is the vertical component of $F_L$,
$L_i$ is the spring length without any load applied ($F_L$=0),
dL is the change in the spring length as a load is applied,
K is the spring constant, and
θ is the angle defined by the intersection of the spring length L and the x axis.

The following relationships are defined by the model:

$$\tan\theta = y/x;\ \sin\theta = y/L$$

$$L = \sqrt{x^2 + y^2}$$

$$dL = L_i - L$$

$$F_L = Fx + Fy$$

According to Hooke's Law, the following relationship is known:

$$F = K \cdot s,$$

where s is the displacement of the spring from its equilibrium position when a force F is applied to it. The vertical component Fy of the total load $F_L$ applied to the spring is analogous to the preload force of an individual clover spring flexure. Given the above relationships, solving for Fy involves the following equations:

$$F_L = K \cdot dL$$

$$F_y = \sin\theta (K \cdot dL)$$

-continued $$F_y = y/L \cdot (K \cdot dL)$$

$$F_y = \frac{y}{\sqrt{x^2 + y^2}} \cdot \left[ K(L_i - \sqrt{x^2 + y^2}) \right]$$

$$F_y = \frac{yKL_i - yK}{\sqrt{x^2 + y^2}}$$

$$F_y = yK \cdot \frac{L_i}{\sqrt{x^2 + y^2}} - 1$$

Accordingly, the spring can be modeled as a mechanical system that is predictable for the purpose of transducer design, or otherwise.

Figure 16:
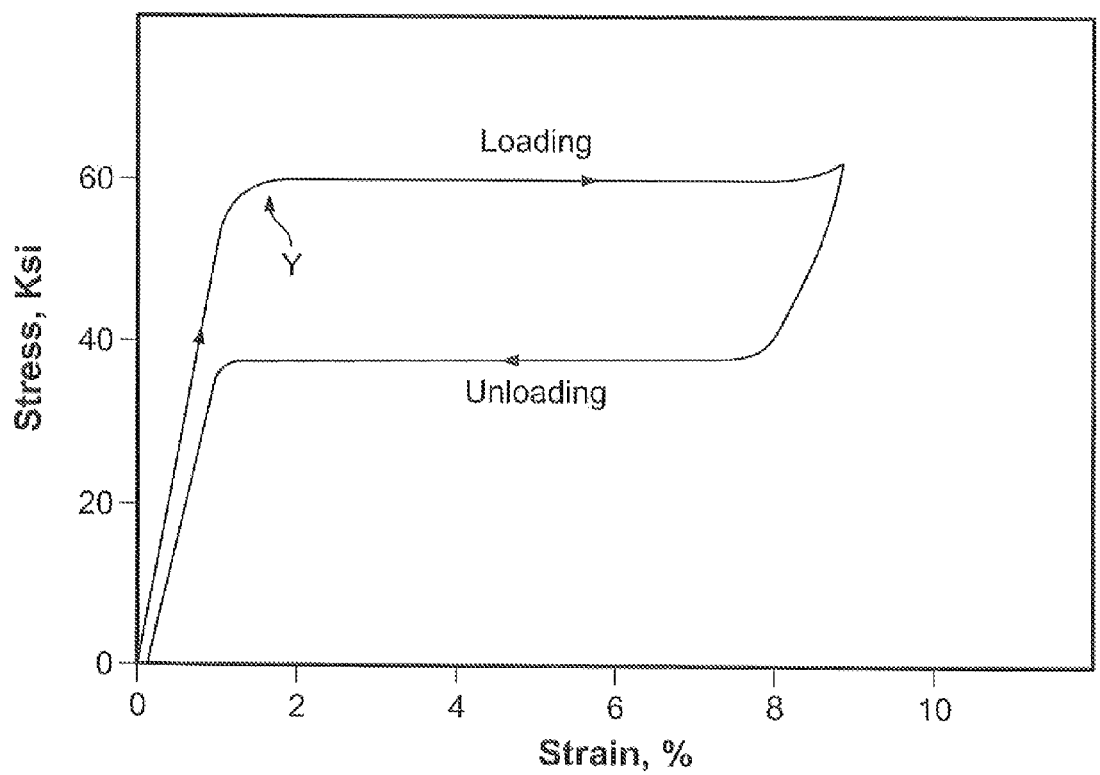
FIG. 16 illustrates the superelastic (pseudoelastic) stress-strain curve of Nickel-Titanium Shape Memory Alloy (SMA) material as may be employed in a spring used in the present invention.

In another aspect of the invention, material selection is employed to produce a bias spring with a desirable rate. Specifically, by constructing a transducer with a superelastic SMA material, such as NiTi, leaf spring, clover type spring or a coil spring that is sufficiently stressed (but not used in a buckling mode of compression as described above), this single bias means it can offer a heavy initial preload, followed by substantially zero-rate spring performances (like a negator spring) for the remainder of the transducer stroke. While not behaving exactly as the stress-strain curve presented in FIG. 16 due to the specific geometric factors of a given spring design, a related output force profile for the bias member can be generated. In such a system, loading above the "yield" point "Y" produces stress-induce martinsite that reverts to austenite with the stress is reduced (i.e., when loading and unloading the spring, respectively). Fatigue life should be considered when employing such a bias member. However, lower fatigue life of such highly stressed elements may not pose a problem in low-cycle applications, such as medical use disposables.

With the above principles in mind, the inventors have found that, depending on the transducer performance characteristics (i.e., work output, power output, force output, stroke distance, stroke frequency) desired, and the type of application in which an EPAM transducer is to be used, the optimum type of bias and the bias rate employed may vary. As such, the present invention involves the selection of the bias type and bias rate which is optimum for a given application. An understanding of the force-stroke relationships of the various bias types/rates facilitates the appropriate selection.

Figure 17A:
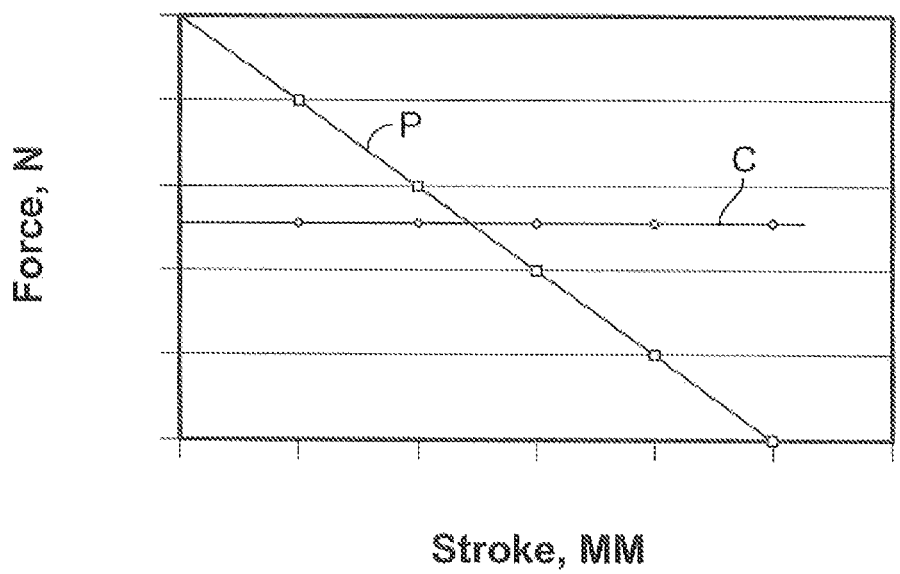
FIG. 17A provides a graph comparing the force-stroke relationships of transducers having an EPAM diaphragm under positive rate spring biasing and constant force biasing, respectively.
Figure 17B:
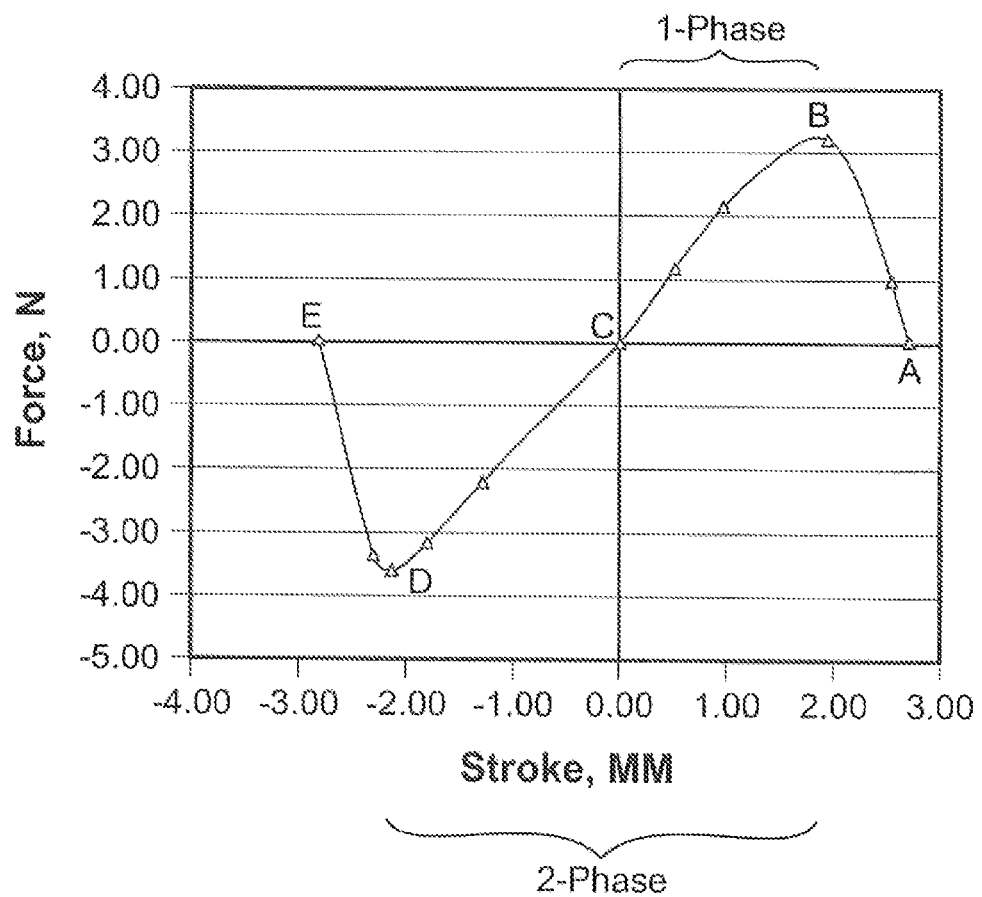
FIG. 17B is a graph showing the force-stroke relationship for the bi-stable negative rate bias spring alone, evidencing the two stable regions.
Figure 17C:
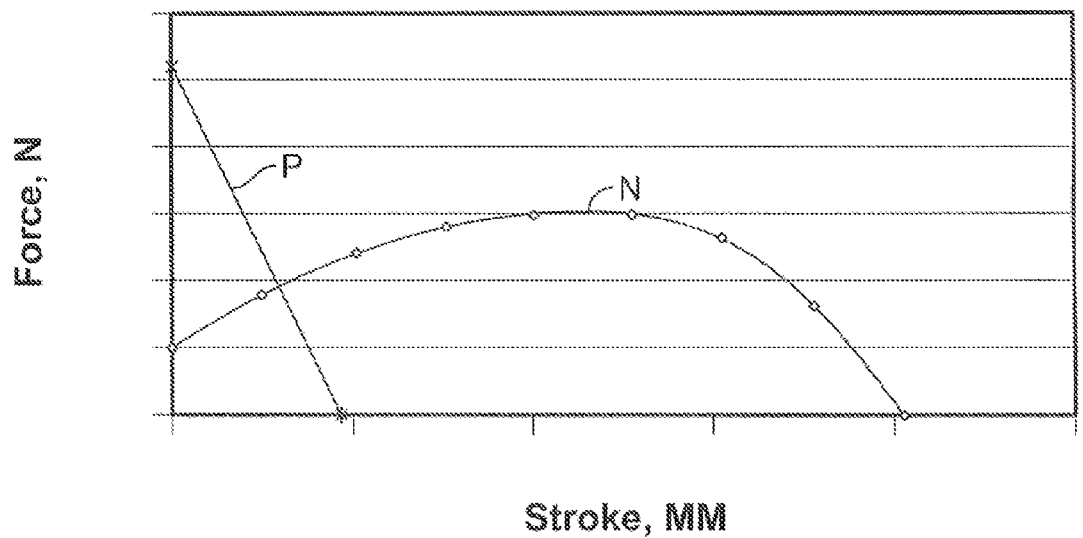
FIG. 17C is a graph comparing the force-stroke relationships of transducers having an EPAM diaphragm under positive rate spring biasing and negative rate spring biasing, respectively.

FIGS. 17A-17C graphically illustrate the force-stroke relationships of bias mechanisms which provide a positive force bias, a constant force bias and a negative force bias. In particular, the lines P and C of the graph of FIG. 17A represent the force-stroke relationships, respectively, of positive force biasing and constant force biasing. As represented by line P, with positive force biasing, the bias force decreases as the spring deflection, and thus the transducer diaphragm stroke distance, increases towards a more stable position. As represented by line C, the force does not change throughout the spring deflection/stroke distance.

FIG. 17B illustrates the force-stoke relationship of negative force biasing, which is inherently bi-stable. Point A on the curve represents the spring's first stable position in which it is fully spring-loaded with no force yet applied to it and, thus, maximally displaced. The portion of the curve between points A and B reflects the initial "buckling" of the spring in which the spring moves from its maximally displaced position, requiring a maximum amount of force required. Point B represents the first inflection point in which the spring's bias rate reverses directions, i.e., the maximum amount of force required for deflection has been reached. The curve between points B and C reflects the fact that continued displacement of the spring requires less force to achieve the first inflection point. Point C reflects the spring's neutral position (unstable equilibrium position) in which it reaches a position of no deflection (stroke=0) at which position no amount of force is necessary to maintain this position. The curve between points C and D reflects the necessary increase in force to continue the spring's deflection past the neutral position. Point D represents the second inflection point in which the spring's bias rate once again reverses direction. Continued deflection of the spring, reflected between points D and E, requires less force as it once again reaches its maximal displacement, but in the opposite direction). Point E on the curve represents the spring's second stable position in which it is once again fully spring-loaded.

The advantage of a negative biasing over conventional (positive) biasing, at least in the context of transducer stroke distance, is reflected in FIG. 17C which charts the force-stroke curves of transducers biased by a simple coil spring (see FIG. 4) and a clover spring (see FIG. 14), respectively. As represented by line P, as the displacement/stroke distance of the device employing the coil spring increases, the available output force decreases significantly. As represented by line N, as the displacement/stroke distance of the device employing the clover spring increases, it takes significantly less force to achieve a greater stroke distance. For example, the coil spring-biased device, at about 0.15 N of force produces a stroke distance of about 0.25 mm; whereas, at that same force, the clover spring-biased device produces a stroke distance of about 1.0 mm, 4 times that of the coil spring.

Figure 18:
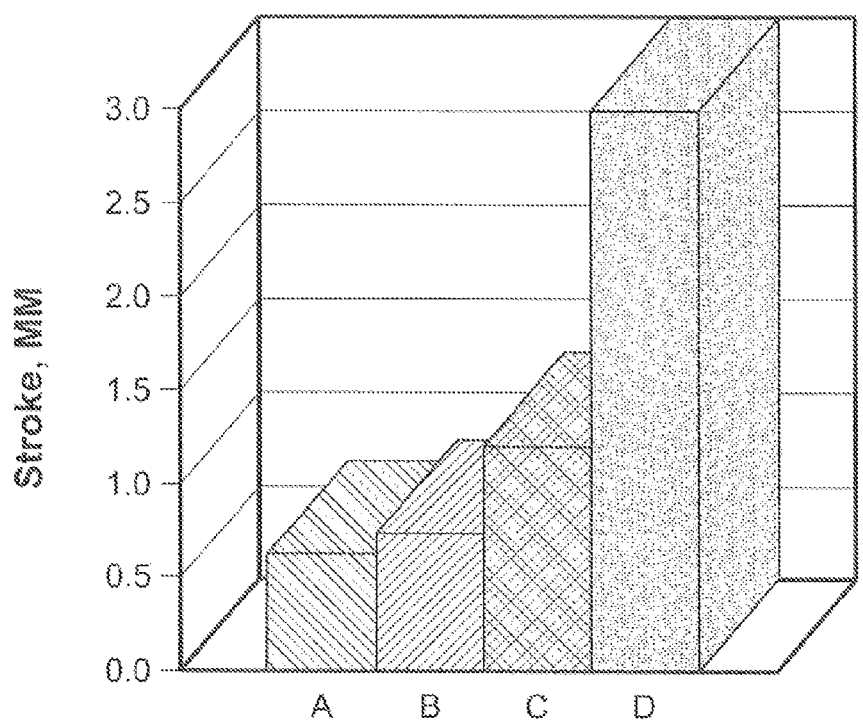
FIG. 18 is a bar graph comparing the maximum stroke distances of EPAM transducers employing various types of biasing.

FIG. 18 presents a bar graph illustrating the relative stroke characteristics of various single-phase frustum transducers, each being biased by a different type of bias mechanism: coil spring biased (FIG. 4), film-biased double frustum diaphragm (FIG. 5), constant force mechanism (FIGS. 9, 10) and a negative spring mechanism (FIGS. 11-14). The transducers were constructed to eliminate certain variabilities (e.g., film thickness and layer count) amongst them, and operated at the same DC voltage and as close as possible force (i.e., about 0.5N and about 2.5kv). As illustrated in the bar graph of FIG. 18, the transducer having a diaphragm subject to a negative rate bias (transducer D) achieved a maximum stroke distance far greater than each of the others (from about 2.5× to about 5×), where transducer A was biased by the coil spring, transducer B was biased by an opposing frustum diaphragm, and transducer C was biased by a constant force mechanism.

Figure 19:
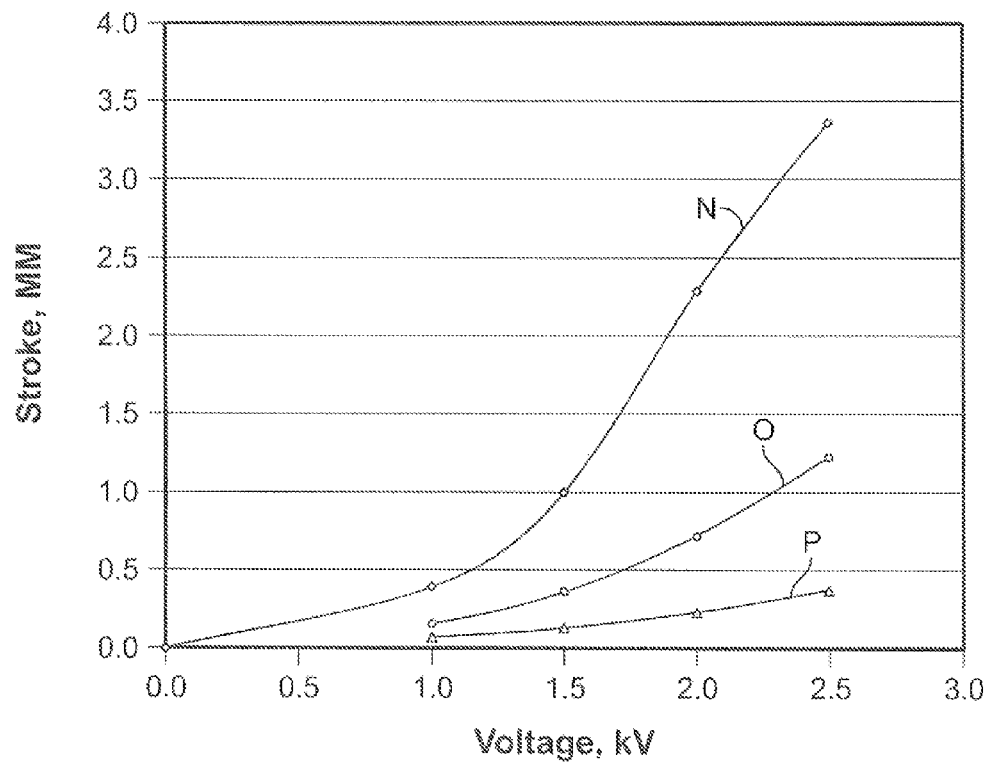
FIG. 19 is a graph comparing stroke capacity of EPAM transducers at various operating voltages.
Figure 20:
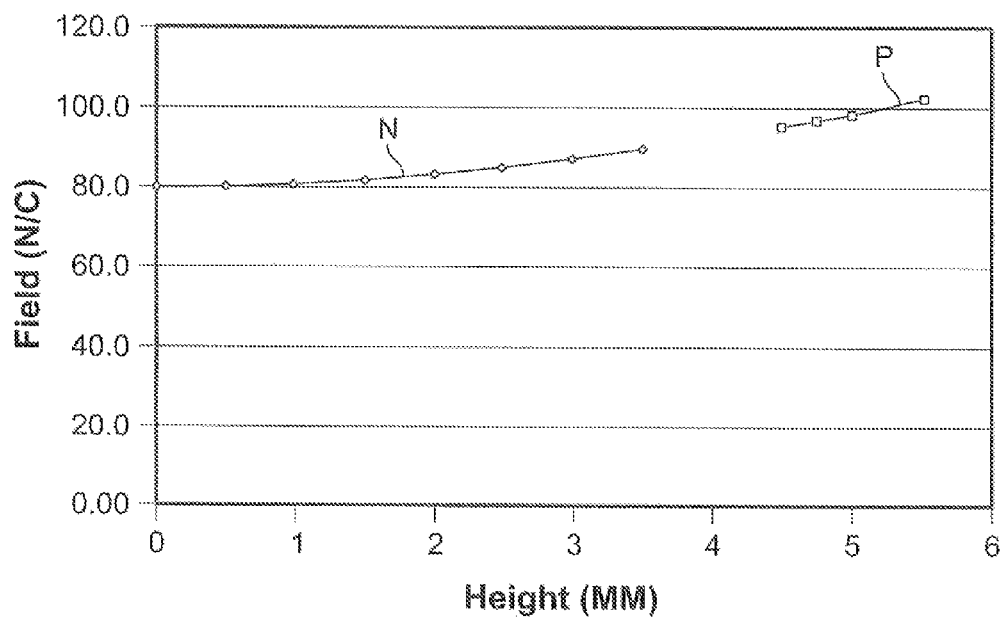
FIG. 20 is a graph comparing electric field values for EPAM transducers under positive and negative biasing, respectively, at the same operating voltage.

Furthermore, as illustrated in the graph of FIG. 19, negative biased transducers (represented by line N) operate within far greater threshold voltages (i.e., the voltage at which there is substantially no corresponding increase in stroke distance) than do comparable transducers biased by positive rate and constant force mechanisms (represented by lines P and C, respectively). Additionally, as shown in FIG. 20, negative biased transducers also advantageously produce a lower electric field (N/C) than do comparable positive biased transducers at the same operating voltage.

Another advantage of negatively biased devices of the present invention is that they are inherently bi-stable. As evidenced by the graph of FIG. 17B and discussed above, negatively biased transducers having a single frustum structure (as illustrated in FIG. 14) can therefore be employed in two-phases to deliver output (or receive input) in two different directions. In physical terms, points B and D define the end points (i.e., commencement and termination) of the buckling or "snap" experienced by the biasing structure (equivalent to the "snap" undergone by a keyboard dome switch, for example). The portion of the curve between points A and B can be controlled by matching the diaphragm's film stiffness/thickness and the preload applied to the diaphragm. In other words, the film stiffness can be selected (or is inherently) such that the spring coupled to the film does not move into this region.

Figure 21:
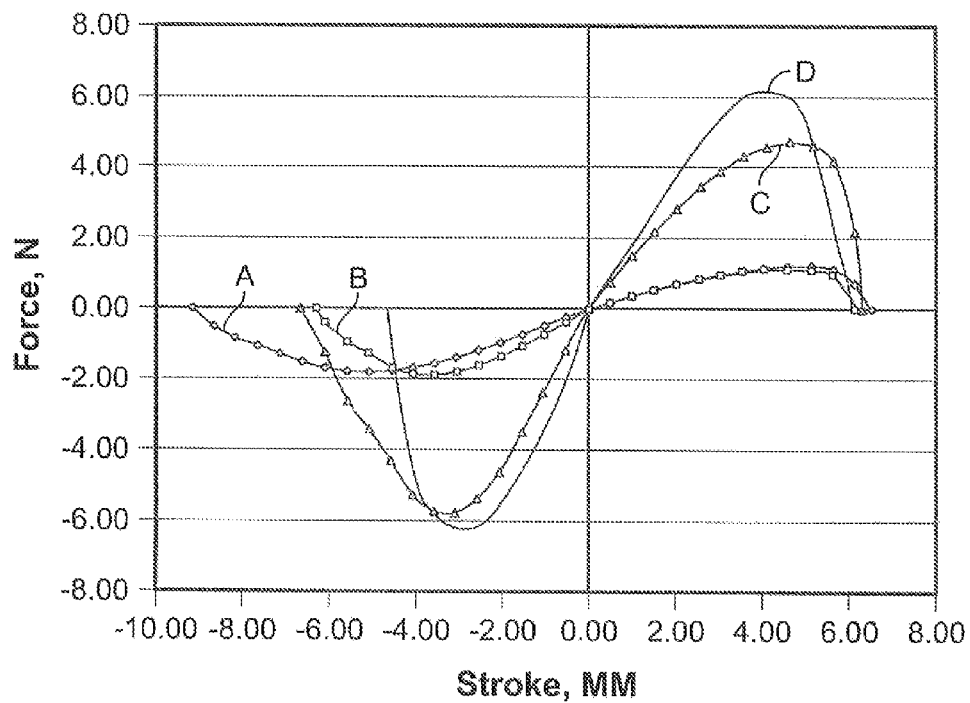
FIG. 21 is a graph illustrating the force-stroke relationship for various EPAM transducers biased by a clover leaf type negative biasing mechanisms having varying leaf lengths and positioned at varying angles relative to the frame surface.

This is evidenced in FIG. 21 which illustrates the force-stroke relationships of a selection of frustum-shaped, negative biased transducers having varying film thicknesses and varying preload/bias angles (i.e., the angle that the uncapped portion of the diaphragm makes with the plane defined by the transducer frame (angle α in FIG. 2B).

The transducers (A-D) in the experiment conducted had the following film thicknesses and bias angles: A: 0.010", 20°; B: 0.010", 25°; C: 0.015", 25°; D: 0.020", 25°. From the plotted force-stroke results, the following observations can be made: (i) with these variations in thickness and bias angle, there was virtually no difference in the initial diaphragm disc height amongst the transducers; (ii) the total stroke distance is more dependent upon bias angle and less dependent upon film thickness; (iii) the force necessary for the transducer diaphragms to achieve the stable positions is more dependent on film thickness and less dependent upon bias angle; and (iv) negative biased (as well as positive and constant force biased) transducers offer an immense degree in tunability (in output performance characteristics) while minimizing space and weight requirements.

As with the positive spring bias and constant spring bias transducers, the negative bias transducers of the present invention may be stacked to modify the system's output force (i.e., spring constant) or the stroke distance (i.e., deflection). Stacking the frustum transducers in the same direction (parallel stacking) increases the output force/spring constant with the same stroke/deflection. Stacking the transducers in alternating directions (series stacking) results in greater stroke without changing the output force.

Selectively mixing and matching directions of the transducers allows a specific output force and stroke capacity to be designed into a system. Additionally, for more complex applications, it may be desirable to employ more than one type of bias with a transducer assembly. With the NiTi spring variations described above, such a result is achieved—in effect—by a single bias member in transducer/bias member architecture as shown in any of FIGS. 4, 11, or 13A-13C, etc. (i.e., without buckling the leaf or "clover" spring members). Moreover, a transducer assembly may have any combination of transducer architectures (e.g., single frustum, double frustum or both), stacking configurations (i.e., serial or parallel or both), and biasing mechanisms (e.g., positive, constant, negative or any combination thereof).

Figure 22:
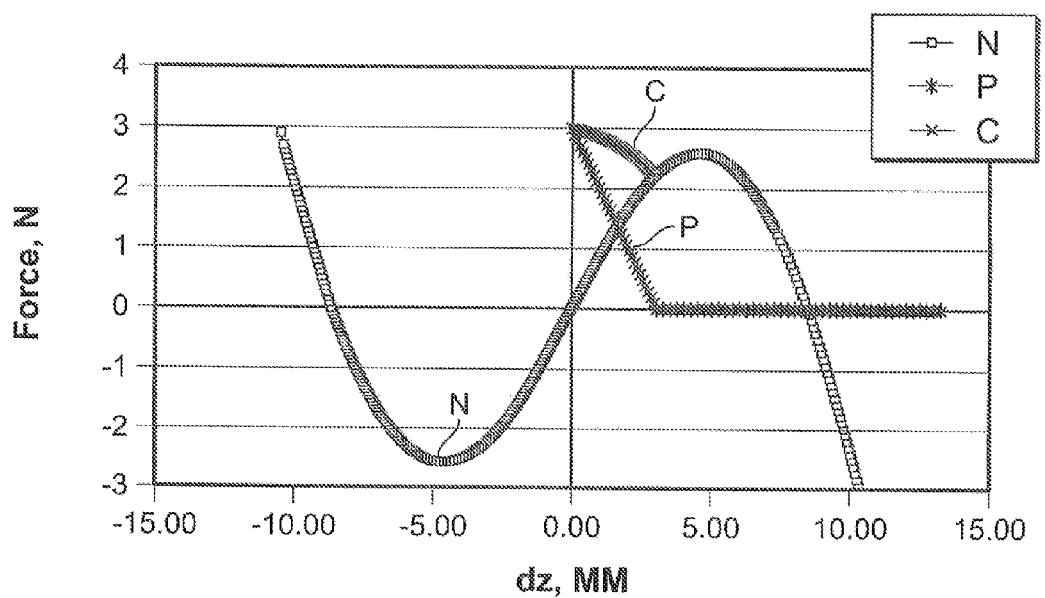
FIG. 22 illustrates the force-stroke relationship for an EPAM transducer having biasing mechanism exhibiting a combination of a positive bias rate and a negative rate bias to yield a combined bias rate.

FIG. 22 illustrates the effect of combining a positive bias spring rate "P" (active/engaged over a portion of the length of transducer stork) in combination with a negative rate bias "N" (active/engaged over the entire length of transducer stroke) to yield a combined bias rate "C".

Figure 23:
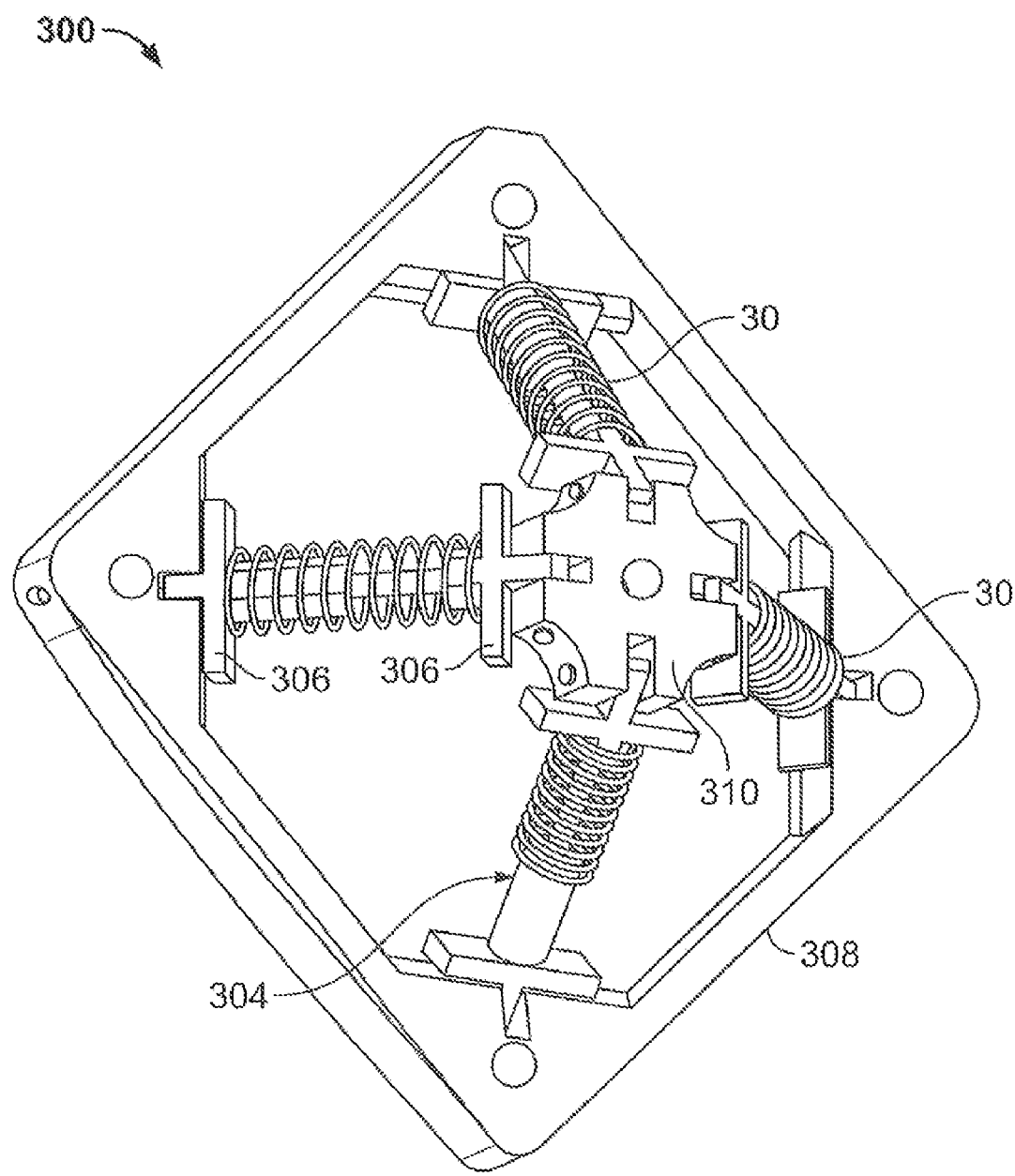
FIG. 23 is a perspective view of a linkage bias cartridge assembly employed in the transducer shown in FIG. 26.

Yet another biasing approach is illustrated in FIG. 23. Here, a linkage-based bias cartridge 300 is provided comprising a plurality of simple compression springs 302 carried by telescoping links 304 and constrained by stops 306 between an outer frame 308 and central boss 308. While the buckling/unbuckling beam variations of the negative bias spring 160 discussed above requires somewhat of an abstract comparison to the Bellville Washer model, above, each quadrant of negative-rate bias 300 offers an essentially direct comparison.

Figure 24A:
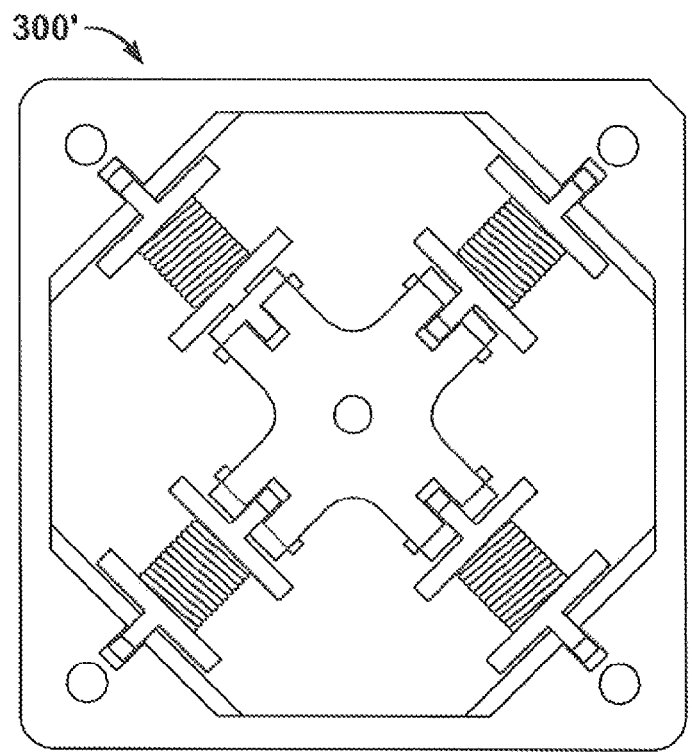
FIGS. 24A and 24B are top views of a device as shown in FIG. 23 having varied configurations, each selected to tune the biased cartridge assembly to a desired spring rate.
Figure 24B:
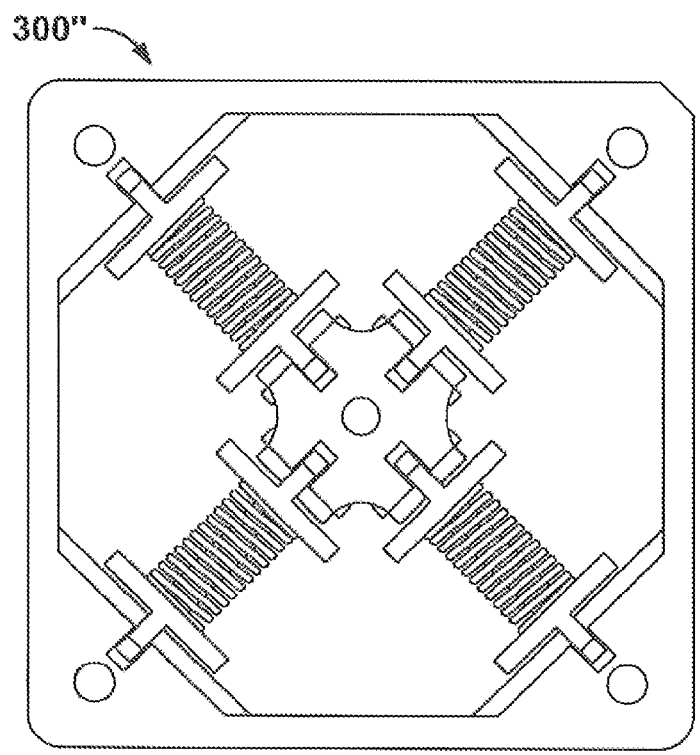

While mechanically more complex than the buckled "clover spring" approach described above, the linkage device is advantageous for a number of other reasons. Namely, it is very easily tuned. For example, its modularity allows for simple substitution of springs to achieve different overall rates. Free length of the springs can be increased or decreased and/or preload on the spring can be increased or decreased. Such variation may be observed in comparing the cartridge configurations 300' and 300" as shown in FIGS. 24A and 24B. Further variation for spring rate tuning/design is possible in connection with hub size, telescoping linkage length, stop position, frame size, linkage number, etc.

Figure 25A:
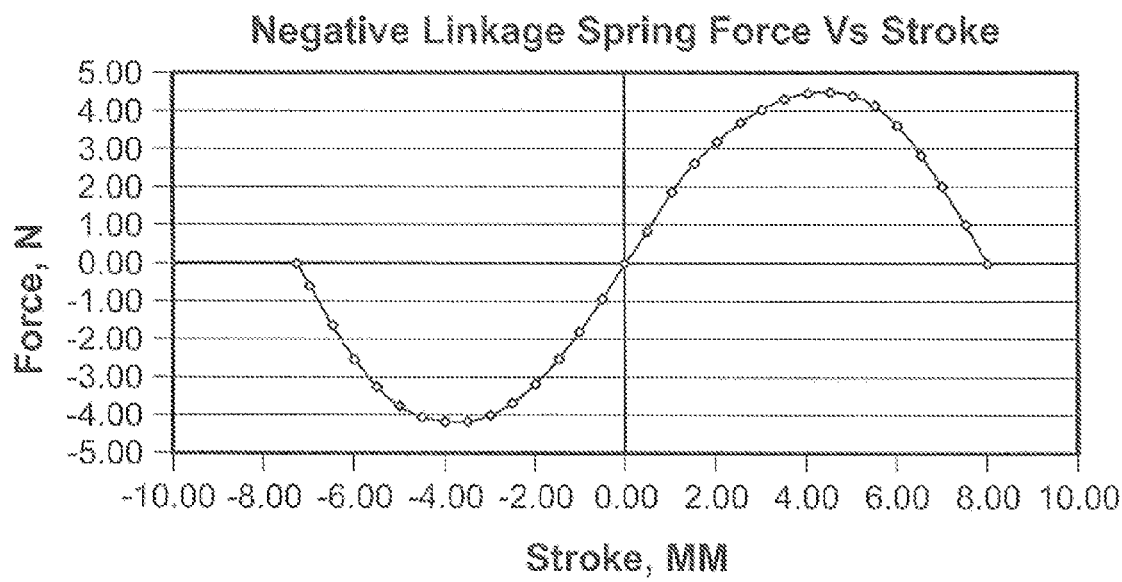
FIG. 25A illustrates the exemplary performance of a cartridge spring assembly as shown in its various stages of 2-phase actuation in FIG. 25B.
Figure 25B:
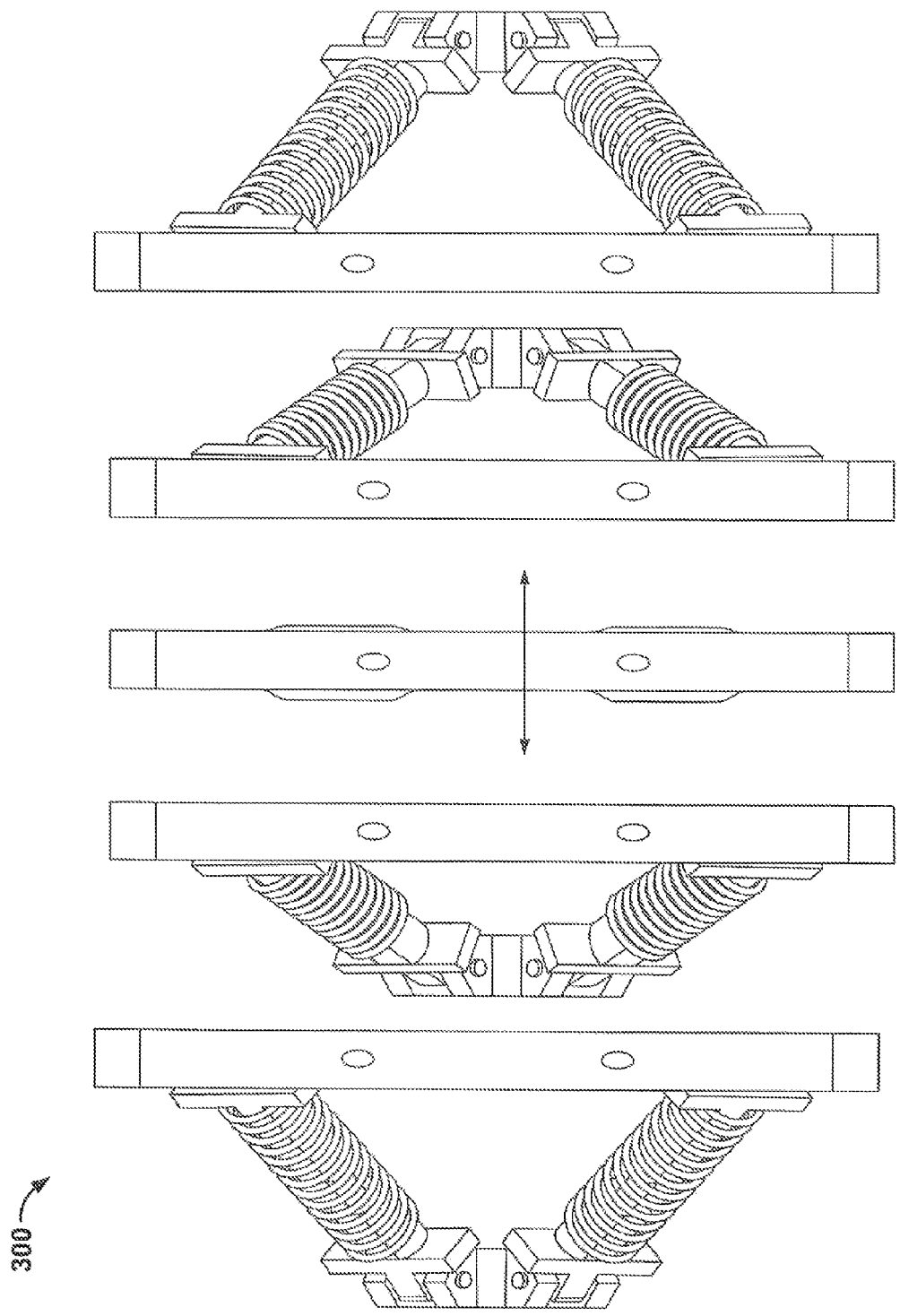
FIG. 25B illustrates various stages of 2-phase actuation of the biased cartridge assembly of FIG. 23.

In addition, while some asymmetry in bi-stable performance may be inherent to buckling spring devices as shown in FIGS. 13A-13C (though this can be addressed by using opposite-facing members in a "stack") the operation of linkage spring assembly 300 is naturally symmetrical so long as symmetrical frame components are employed. FIG. 25A illustrates the exemplary negative rate performance of a cartridge spring assembly 300 as shown in its various stages of 2-phase actuation in FIG. 25B.

Figure 27:
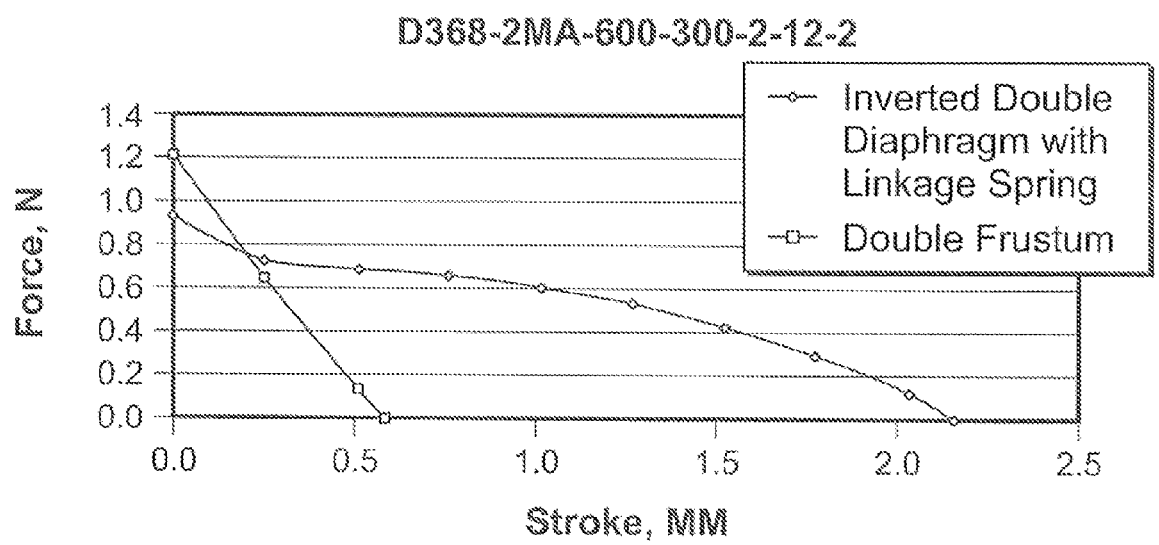
FIG. 27 illustrates the comparative performance of an EPAM transducer assembly as shown in FIG. 26 with one as shown in FIG. 5.

Yet another advantage is the ease with which a spring cartridge assembly 300 is in integrated into an actuator assembly as simply one more layer of a double-frustum stack. An example of such an assembly is shown in FIG. 26. Together with appropriate fasteners and spacers 310, bias cartridge 300 is joined to a pair of frustum-type EPAM transducer cartridges 312. The overall transducer assembly 314 produced is a double-frustum EPAM transducer incorporating a bias cartridge. FIG. 27 illustrates the comparative performance of transducer assembly 314 (labeled, "inverted double diaphragm with linkage spring") as compared to a "simple" transducer 30 (labeled, "double diaphragm") as shown in FIG. 5. The performance enhancement is dramatic in terms of available stroke, thus, work output or power potential.

Figure 28A:
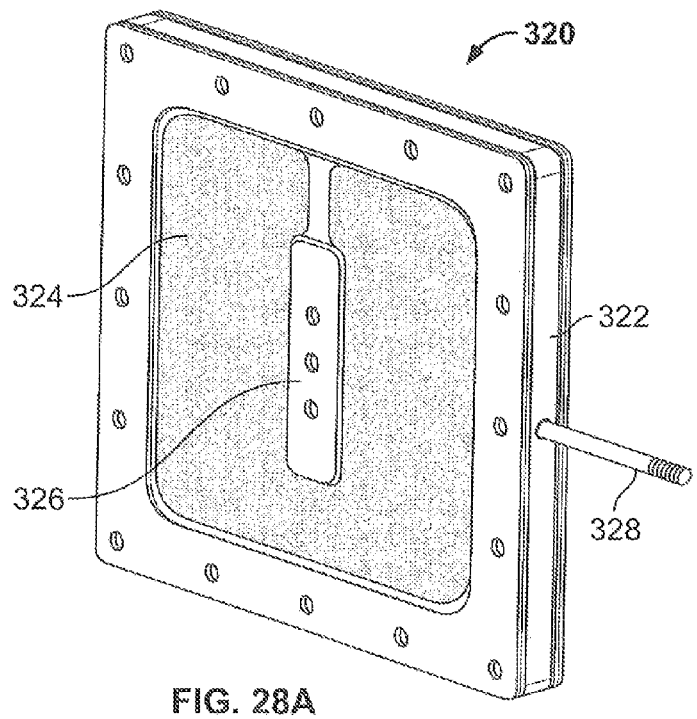
FIG. 28A is a perspective view of a "planar" type linear transducer including another type of negative spring rate assembly according to the present invention.
Figure 28B:
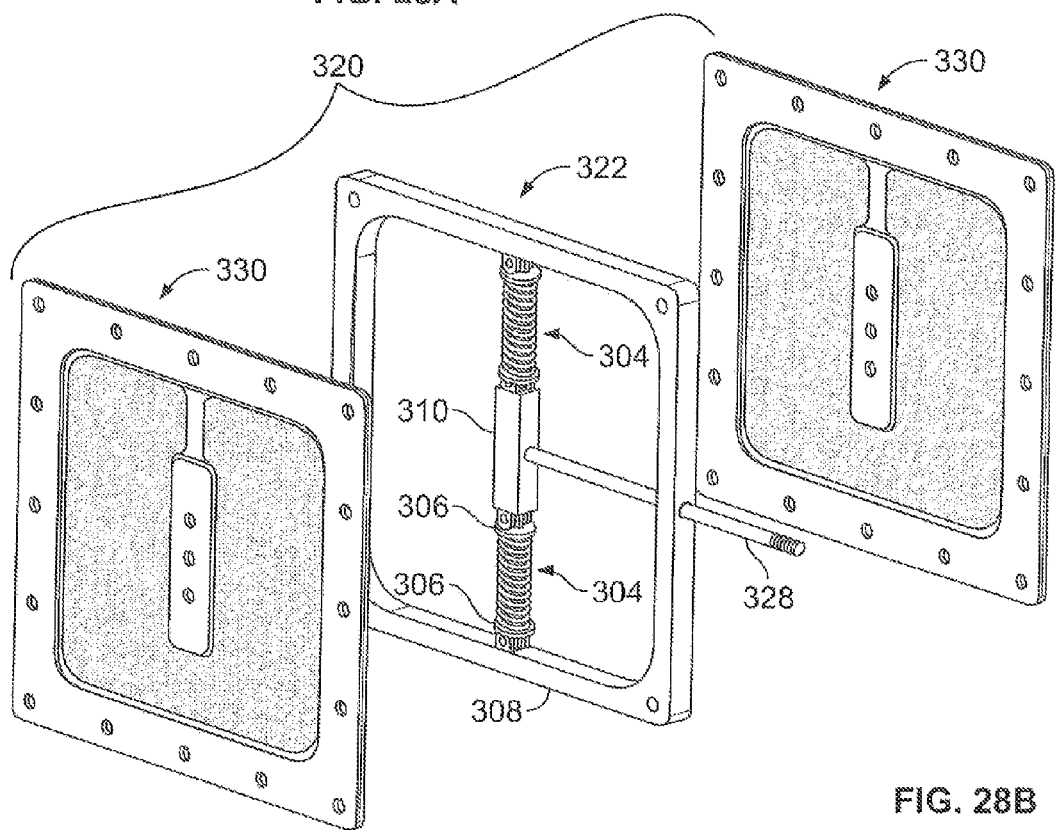
FIG. 28B is an exploded view of the transducer of FIG. 28A.
Figure 29C:
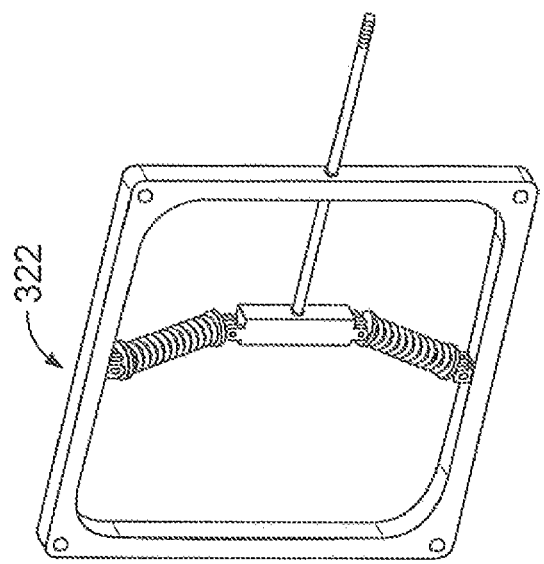
FIG. 29A-C illustrates the bias assembly shown in FIGS. 28A and 28B in three stages of 2-phase actuation.
Figure 29B:
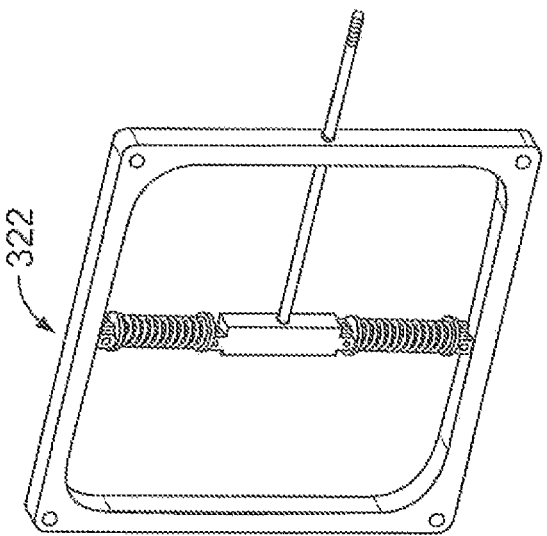
Figure 29A:
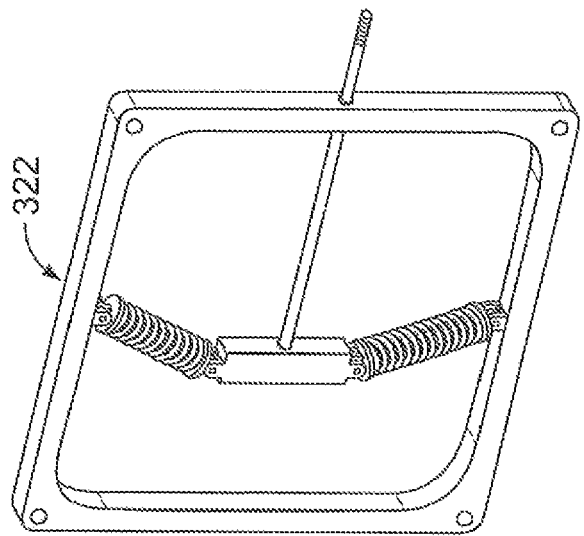

FIG. 28A is a perspective view of a "planar" type of linear transducer/actuator 320 including a lateral input/output type of negative spring rate "cartridge" bias assembly 322. In such a device, lateral movement of the EPAM material 324 in connection with interface member 326 causes translation of output rod 328. Absent the included negative rate bias cartridge 322, details of planar EPAM devices are available in the various references incorporated herein—above. As illustrated in the assembly drawing view of FIG. 28A, transducer 320 comprises, together with appropriate fasteners, bias cartridge 322 joined to a pair of planar EPAM transducer cartridges 330. FIG. 29A-C illustrates the negative bias assembly 322 shown in FIGS. 28A and 28B in three stages of its potential two-phase actuation cycle (corresponding to the In/Out/Neutral positions respectively, as illustrated in FIGS. 29A, 29C and 29B of the output rod 222 labeled on the drawing).

As with the out-of-plane actuated negative spring cartridge 300, in-plane negative spring bias cartridge 322 is highly variable in configuration for tunable output. Still, it is to be appreciated that significant modifications can be made to the structures without departing from the spirit of the invention. For example, hub 310 can be minimized or eliminated, pivoting hinges can be replaced with living hinges or ball joints, frame 308 may be integrated with an EPAM cartridge frame, etc.

Figure 30A:
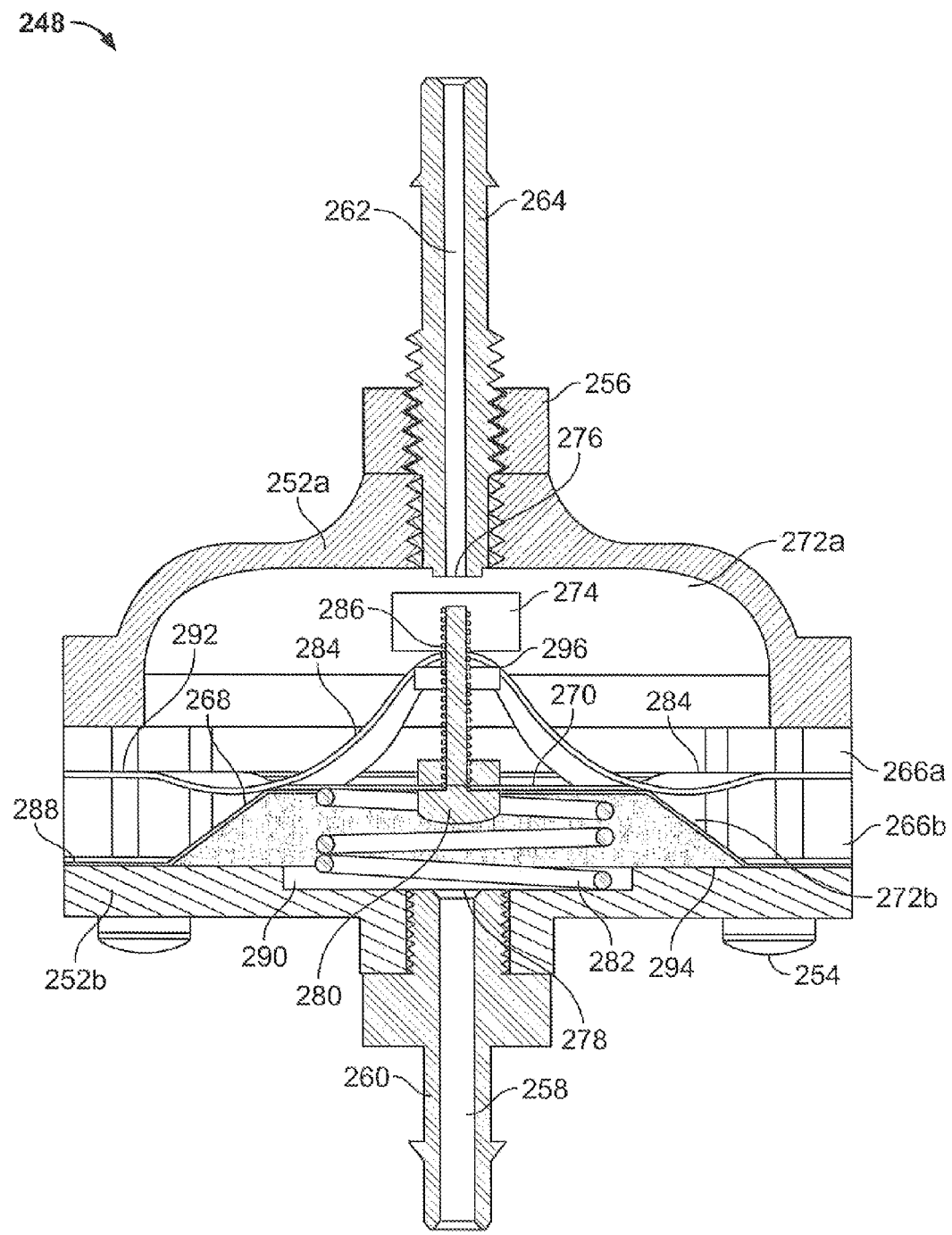
FIGS. 30A-30C illustrate fluidic valve applications of the transducers of the present invention, each biased in a different manner.
Figure 30B:
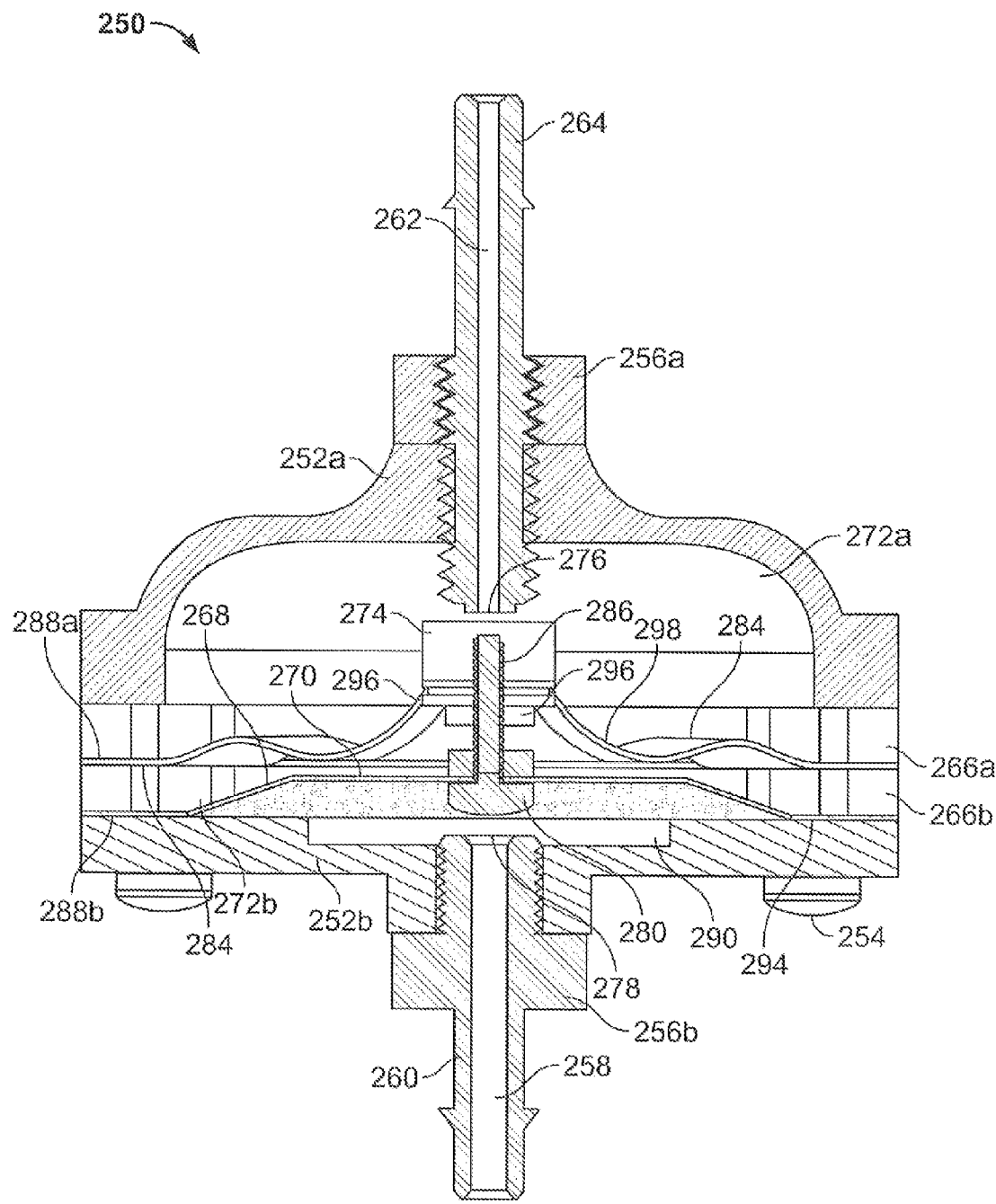

FIGS. 30A and 30B illustrate two exemplary applications in which at negative rate clover leaf flexures are employed. Both applications involve fluidic control mechanisms 248, 250 in which the opening and closing of valve inlet and outlets are controlled with the transducers. The valves each include a housing which may be a two-piece structure for ease of manufacture in which top and bottom housing portions 252a, 252b are secured together subsequent to constructing the interior components of the valves. Extending from a top surface of top housing 252a is a fluid outlet conduit 264 having a fluid outlet lumen 262 which is in fluid communication within an upper portion 272a of an interior chamber within the top portion of the valve at outlet orifice 276. Similarly, extending from the bottom surface of bottom housing portion 252b is a fluid inlet conduit 260 having a fluid inlet lumen 258 (i.e., liquid, gas, vapors, etc.) which is in fluid communication within a lower portion 272b of the valve chamber at inlet orifice 278. The upper and lower portions of the fluid chamber are in fluid communication with each other by way of one or more openings (not shown) within capping member 270. As illustrated, the housing portions and conduits may be held together in any suitable manner, including by way of threaded surfaces and mating nut components 256a, 256b. Alternatively, the housing and conduits may be integrally fabricated into a monolithic structure by molding techniques or the like.

The respective transducer portions of valves 248, 250 each includes a single-frustum, double-phase transducer component mounted to the valve housing within fluid chamber 272. Specifically, the transducer components each include an EPAM diaphragm 268 stretched within a frame 288 and a cap portion 270 centrally attached to the diaphragm. Frame 288 is sandwiched between the top and bottom portions 252a, 252b of the valve housing such that the cap portion is positioned generally perpendicular to the luminal axes of the fluid inlet and outlet conduits 260, 264. Specifically, in the illustrated embodiments, frame 288 is held between a spacer member 266b and bottom housing portion 252b.

An inlet sealing member 280, which in these embodiments is a screw head, is positioned on the underside of capping member 270. The screw's stem extends through and from the top side of cap member 270 and is held fixed to the cap member by a nut 294 threaded to the screw's stem 286. Positioned at the distal end of screw stem 286 is an outlet sealing member or valve seat 274. Both sealing members 274, 280 are configured to seal respective opposing orifices 276, 278 when in contact therewith. For example, to facilitate sealing, the screw head may be covered by or be made entirely of a compliant polymer material.

In both valve embodiments 248, 250, a clover buckled spring is provided on the top side of capping member 270. The spring flexures 284 are positioned so as to provide a negative-rate, downward force on cap member 270 towards inlet opening 278. The free or outward-extending ends 292 of the flexures are held fixed between the two housing portions; specifically between another spacer 266a and top housing portion 252a. As such, the two spacers 266a, 266b in each of the embodiments are stacked and interposed with the flexures and diaphragm frame to maintain a selected spacing between them. The inwardly extending ends of flexures 284 are joined (if not made from a single piece) together and captured or held between a nut 296 threadedly engaged with screw stem 286 and outlet valve seat 274.

While the valve components described thus far are substantially the same for both valves 248, 250, other components and features of the respective valves are provided which differentiate the biasing of their transducers. Unlike valve 250, valve 248 further includes a conventional or positive-rate coil spring 282 interposed between the capping member 270 and the interior wall 290 of bottom housing 252b. Coil spring 282 acts to pre-load or bias diaphragm 268 and cap member 270 to better seal opening 278. The combination of springs offers the blocking force of a coil spring bias with the overall stroke seen in a negative spring rate biased structure. In another example (not shown), similar (albeit less dramatic) advantages are offered by combining a positive-rate coil spring with a negator spring or weight bias.

In fact, a very similar performance profile can be achieved by employing a spring (e.g., a coil spring or leaf spring) comprising superelastic NiTi as discussed above. Without further geometric manipulation (e.g., as with the buckled/ buckling springs employed in the embodiments discussed above), the spring rate will roughly parallel the materials natural stress stain performance shown in FIG. 16 to offer a spring that first compresses with a positive rate, then at a substantially flat rate.

With valve 250, on the other hand, the transducer diaphragm is pre-loaded by way of the "pulling" force exerted on it by coupling capping member 270 to the clover leaf spring. This coupling is accomplished by a plate member 298 attached to nut 294 and extending over and contacting the outwardly flexed portions of the flexures 284. Plate 298 provides a buttressing surface against which the flexures exert a force which is in turn translated to capping member 270 via nut 294 and screw stem 286. In such a valve, the bias preload can be configured such that the valve is either naturally/ normally open or closed.

Figure 30C:
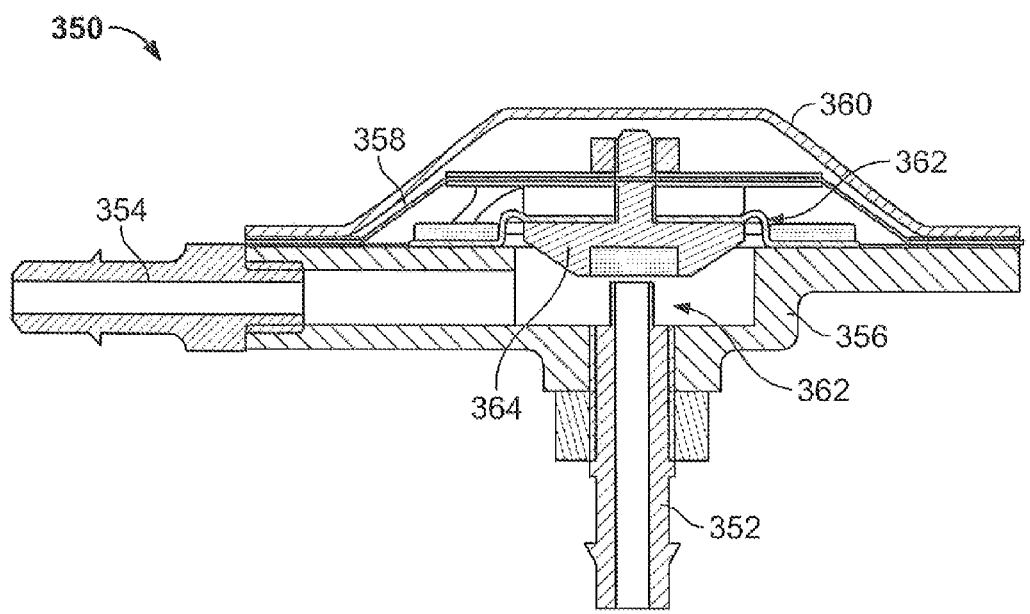

In yet another application, a molded diaphragm negative rate bias member is provided. FIG. 30C shows a valve assembly 350 comprising inlet and outlet ports 352, 354—respectively—received within a valve body or housing 356. An EPAM frustum-type actuator 358 is covered by an actuator cap 360 joined to the valve body. In the valve 350, position of valve poppet 362 is controlled by actuator 358. The actuator is biased, and valve chamber 362 closed by bias diaphragm 364. As such, in this variation, the negative-rate bias member (bias diaphragm 362) serves dual-duty as a bias spring and baffle wall within the valve body.

Figure 31:
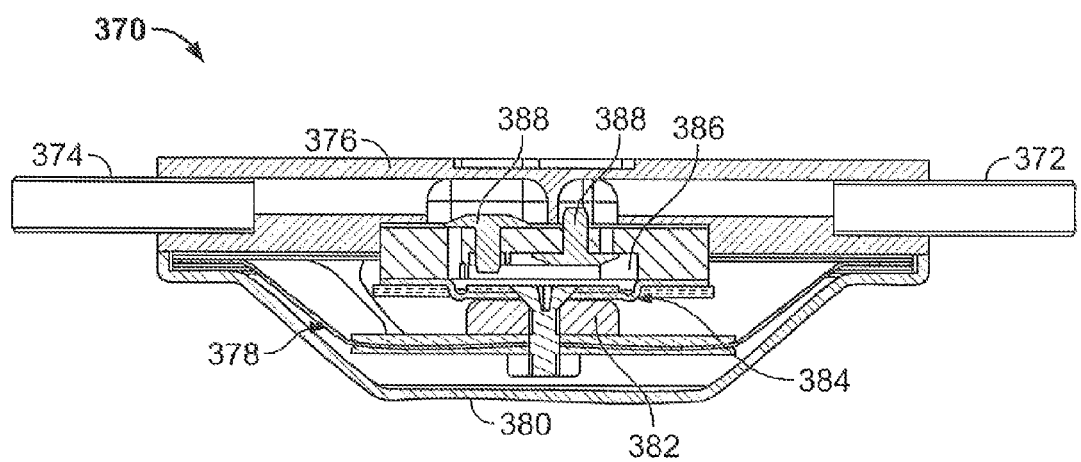
FIG. 31 illustrates a fluidic pump transducer biased in the manner of the valve transducer in FIG. 30C.

FIG. 31 shows a pump assembly 370 biased in the manner of the valve transducer in FIG. 30C. Specifically, assembly 370 comprises inlet and outlet ports 372, 374—respectively—received within a pump body or housing 376. An EPAM frustum-type actuator 378 is covered by a protective actuator cap 380 joined to the pump body. The actuator drives pump piston 382 and is biased by bias diaphragm 384. Bias diaphragm 384 also completes pump chamber 386 in communication with check valves 388.

Figure 32:
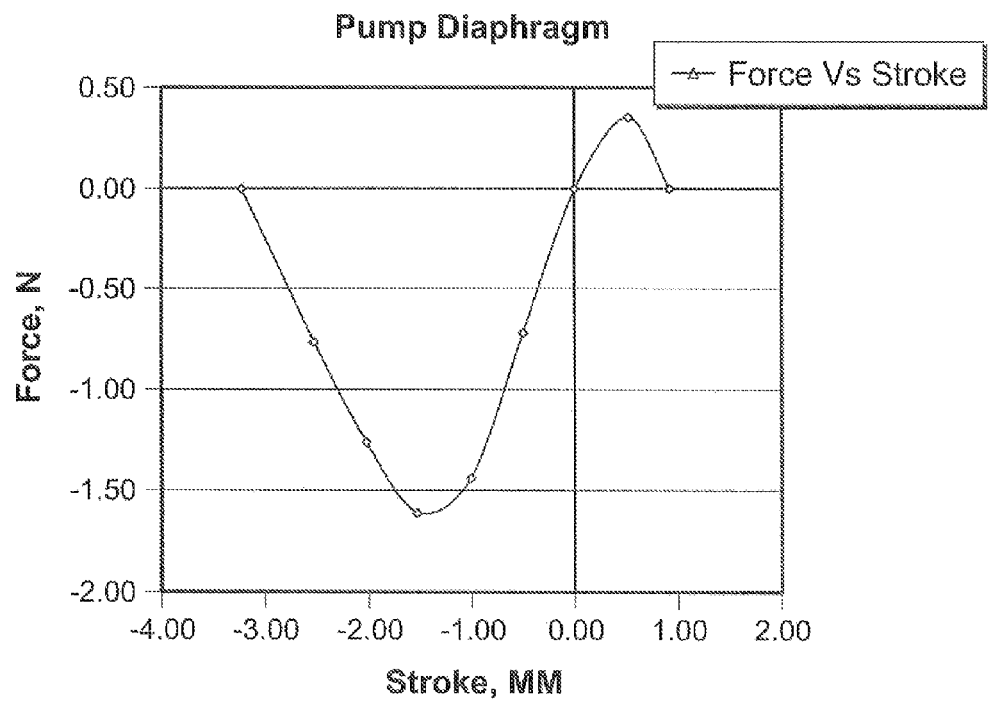
FIG. 32 is a chart showing the performance of a molded diaphragm negative spring.
Figure 33:
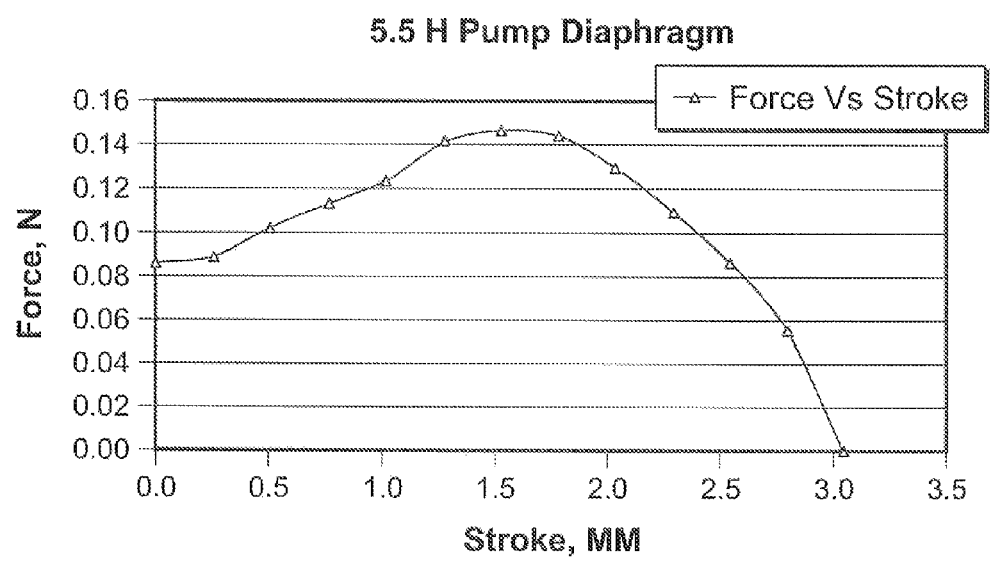
FIG. 33 is graph illustrating the force-stroke relationship of a transducer pump mechanism of the present invention, such as that shown in FIG. 31, employing a molded diaphragm negative spring.

FIG. 32 illustrates the spring rate of molded rubber biased diaphragm 364/384. In this example, the part is molded in NITRILE rubber. Other potential materials for molding the piece include, but are not limited to SILICONE, Neoprene®, Epichlorohydrin, Fluorosilicone, Viton® and Propylene. FIG. 33 illustrates the measured performance of a molded diaphragm negative spring over a selected region of travel. This experimental output curve is in substantial agreement with the theoretical discussion of negative rate springs discussed above.

Figure 34:
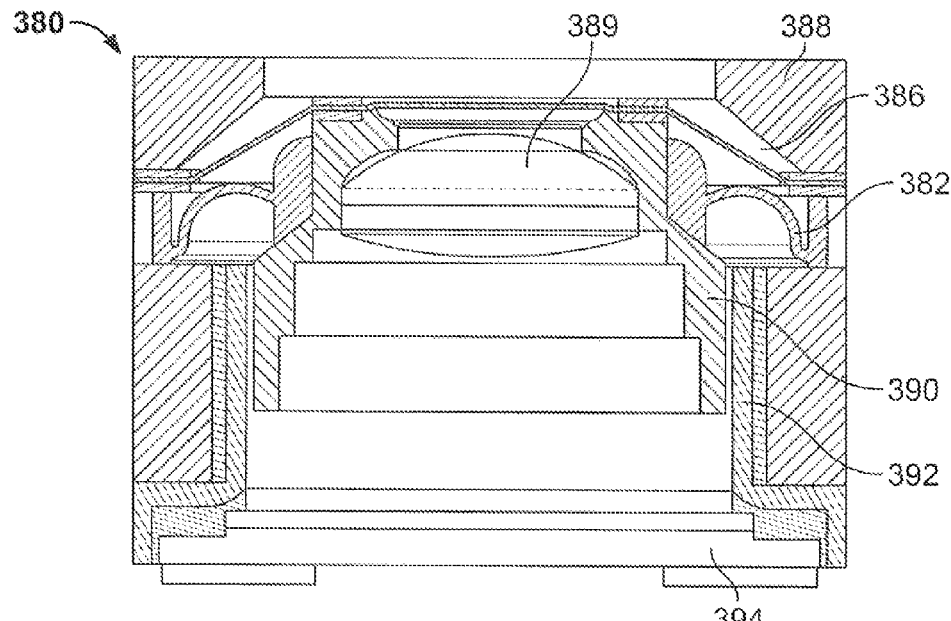
FIG. 34 shows a lens positioner/focus assembly employing a transducer biased by a negative rate molded spring element.

The final application of a negative rate spring biased transducer discussed herein (though a myriad of other application are possible) is shown in FIG. 34. Here, a lens positioner/ focus assembly 380 is proved that employs a transducer negatively biased by a molded spring element 382. In general terms, assembly 380 further comprises a lens 384, an EPAM actuator 386, a top housing 388, a lens barrel 390, an alignment bushing/housing 392, and finally a CCD chip 394 to capture images.

Figure 35:
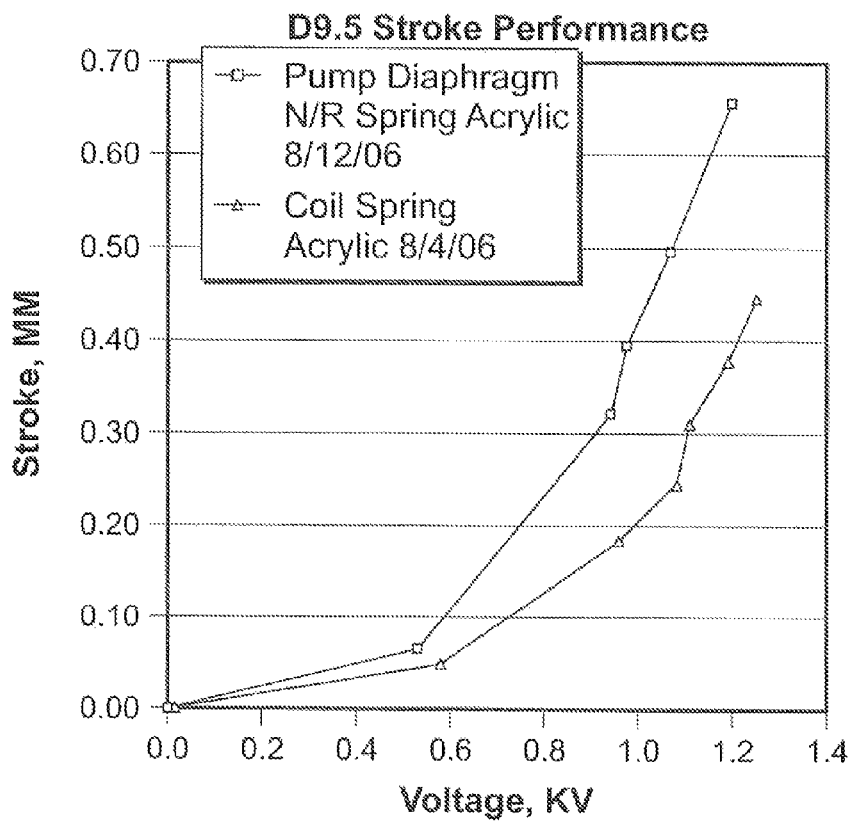
FIG. 35 illustrates the relative stroke performance of a device as shown in FIG. 34, as compared to one employing coil spring biasing.

FIG. 35 illustrates the relative performance of a device as shown in FIG. 34 (curve 396) as compared to a coil-spring biased device employed in the same application (curve 398). As expected of a negative-rate biased spring actuator according to the present invention, improved overall stroke and more stroke at lower voltage is available.

As for other applications, it is also contemplated that the biasing approaches disclosed herein may be employed in systems which provide for multi-angle/axis sensing or actuation. This is effected by providing a diaphragm, for example, with three independently addressable zones or phases having different stiffness/flexibility which, when activated, will expand differently causing the capping member to tilt on an angle. In a frustum-style actuators such a multi-phase device can provide multi-directional tilt as well as translation depending on the manner of control.

Based on the above, it should be apparent that any number of parameters of the subject transducers can be varied to suit a given application. A non-exhaustive list includes: the type, rate and extent of biasing or preload placed on an EPAM film; the amount of prestrain on the film (magnitude, angle or direction, etc.); film type (silicone, acrylic, polyurethane, etc.); film thickness; active vs. non-active layers; number of layers; number of film cartridges; number of phases; the number of transducers; the manner of stacking, etc. For example, the one or more spring rates of the transducers/transducer assemblies may be selected and adjusted by bias type, construct, spring constant, force rate, diaphragm film thickness, frame construct, diaphragm film material, etc. to achieve the performance characteristics desired.

The constituent transducer components may be bonded together using any viable technique such as adhesives, thermal bonding, friction welding, ultrasonic welding, or be mechanically locked or clamped together. Regardless of the configuration selected for the subject transducers, various manufacturing techniques are advantageously employed. Specifically, it is useful to employ mask fixtures (not shown) to accurately locate masks for patterning electrodes for batch construction. Furthermore, it is useful to employ assembly fixtures (not shown) to accurately locate multiple parts for batch construction. Other details regarding manufacture may be appreciated in connection with the above-referenced patents and publication as well as generally know or appreciated by those with skill in the art.

Methods associated with the subject devices are contemplated in which those methods are carried out with EPAM™ actuators. The methods may be performed using the subject devices or by other means. The methods may all comprise the act of providing a suitable transducer device. Such provision may be performed by the end user. In other words, the "providing" (e.g., a pump, valve, reflector, etc.) merely requires the end user obtain, access, approach, position, set-up, activate, power-up or otherwise act to provide the requisite device in the subject method.

Regarding methodology, the subject methods may include each of the mechanical activities associated with use of the devices described as well as electrical activity. As such, methodology implicit to the use of the devices described forms part of the invention. The methods may focus on design or manufacture of such devices. In other methods, the various acts of mechanical actuation are considered; in still others, the power profiles, monitoring of power and other aspects of power control are considered. Likewise, electrical hardware and/or software control and power supplies adapted by such means (or otherwise) to effect the methods form part of the present invention.

Yet another aspect of the invention includes kits having any combination of devices described herein—whether provided in packaged combination or assembled by a technician for operating use, instructions for use, etc. A kit may include any number of transducers according to the present invention. A kit may include various other components for use with the transducers including mechanical or electrical connectors, power supplies, etc. The subject kits may also include written instructions for use of the devices or their assembly. Such instructions may be printed on a substrate, such as paper or plastic, etc. As such, the instructions may be present in the kits as a package insert, in the labeling of the container of the kit or components thereof (i.e., associated with the packaging or sub-packaging) etc. In other embodiments, the instructions are present as an electronic storage data file present on a suitable computer readable storage medium, e.g., CD-ROM, diskette, etc. In yet other embodiments, the actual instructions are not present in the kit, but means for obtaining the instructions from a remote source, e.g. via the Internet, are provided. An example of this embodiment is a kit that includes a web address where the instructions can be viewed and/or from which the instructions can be downloaded. As with the instructions, this means for obtaining the instructions is recorded on suitable media.

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth n the claims. For example, adding a fastener or boss, complex surface geometry or another feature to a "diaphragm" as presented in the claims shall not avoid the claim term from reading on accused structure. Stated otherwise, unless specifically defined herein, all technical and scientific terms used herein are to be given as broad a commonly understood meaning as possible while maintaining claim validity.

In all, the breadth of the present invention is not to be limited by the examples provided. That being said, we claim:

We claim:

1. A transducer assembly comprising an electroactive polymer and at least one biasing element, the improvement consisting of at least one biasing element set to provide a negative spring rate within the transducer assembly.

2. The transducer assembly of claim 1, further comprising at least one other biasing element set to provide a positive spring rate.

3. The transducer assembly of claim 1, wherein the at least one biasing element comprises any of a coil spring, leaf spring, air pressure, fluid pressure or a combination thereof.

4. The transducer assembly of claim 1, comprising a plurality of biasing elements in the form of leaf springs arranged in a clover configuration.

5. A transducer assembly comprising electroactive polymer and a positive, rate biasing element, the improvement consisting of at least one biasing element set to provide a negative or substantially zero spring rate.

6. A diaphragm transducer assembly comprising electroactive polymer and at least one biasing element, the improvement consisting the at least one biasing element having a bistable configuration to allow the transducer to actuate in opposite directions without further biasing.

7. The transducer assembly of claim 6, wherein the diaphragm includes a cap to form a frustum-style assembly.

8. The transducer assembly of claim 1, wherein the transducer assembly forms part of a lens positioner, a valve mechanism, a pump, a light reflector, a speaker, a vibrator, a haptic feedback device or a force feedback device.

9. A negative spring rate assembly comprising:
a compressible member configured to be in a most compressed condition when the assembly is in a neutral position and in a least compressed condition when the assembly is in an extended position; and
an output member associated with the compressible member, wherein the output member is leveraged most when the assembly is in the neutral position and is leveraged least when the assembly is in the extended position.

10. The assembly of claim 9, further comprising a frame associated with the compressible member wherein output force of the output member is substantially perpendicular to the frame.

11. The assembly of claim 9, further comprising a frame associated with the compressible member wherein output force is along a line parallel to the frame.

12. The assembly of claim 9, the compressible member comprises a C or S shaped section of material.

13. The assembly of claim 12, wherein the compressible member comprises a buckled elongate form.

14. The assembly of claim 9, wherein the compressible member comprises a plurality of coil spring and the coil springs are each mounted on a linkage arm, the linkage arms rotatably connected a central hub, the hub providing the output interface.

15. A transducer assembly comprising:
a molded negative race spring diaphragm and electroactive polymer, each coupled to a frame, wherein the electroactive polymer is configured in a frustum shape and wherein the negative rate spring diaphragm is operatively coupled to the electroactive polymer to provide biasing.

16. The transducer assembly of claim 15, further comprising a lens located substantially at a center of the electroactive polymer frustum.

17. The transducer assembly of claim 15, further comprising valve popett located opposite a valve inlet or outlet conduit in a valve body, wherein the spring diaphragm defines a portion of a valve chamber.

18. The transducer assembly of claim 15, further comprising a piston region, substantially at a center of the electroactive polymer frustum, and check valves for inlet and outlet conduits in a pump body, wherein the spring diaphragm defines a portion of a valve chamber.

19. The assembly of claim 9, wherein the compressible member comprises a spring element.

20. The assembly of claim 9, wherein the output member comprises one of a frame, cap structure, linkage and a shaft.

* * * * *

UNITED STATES PATENT AND TRADEMARK OFFICE
CERTIFICATE OF CORRECTION

PATENT NO. : 7,492,076 B2  Page 1 of 1
APPLICATION NO. : 11/618577
DATED : February 17, 2009
INVENTOR(S) : Jonathan R. Heim et al.

It is certified that error appears in the above-identified patent and that said Letters Patent is hereby corrected as shown below:

In column 24, line 9, please replace "spring" with --springs--, and
In column 24, line 14, please replace "race" with --rate--.

Signed and Sealed this

Twenty-first Day of April, 2009

JOHN DOLL
*Acting Director of the United States Patent and Trademark Office*